US006876956B1

(12) United States Patent
Cirak et al.

(10) Patent No.: US 6,876,956 B1
(45) Date of Patent: Apr. 5, 2005

(54) METHOD AND SYSTEM FOR THIN-SHELL FINITE-ELEMENT ANALYSIS

(75) Inventors: Fehmi Cirak, Pasadena, CA (US); Michael Ortiz, La Canada, CA (US); Peter Schroeder, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/491,353

(22) Filed: Jan. 26, 2000

Related U.S. Application Data

(60) Provisional application No. 60/151,618, filed on Aug. 31, 1999.

(51) Int. Cl.[7] ............................. G06F 17/10; G06F 7/60
(52) U.S. Cl. ............................. 703/2; 703/1; 345/423; 345/474
(58) Field of Search .................. 703/1, 2; 345/423, 345/474

(56) References Cited

U.S. PATENT DOCUMENTS

| | | | | |
|---|---|---|---|---|
| 5,581,489 A | * | 12/1996 | Groothuis et al. | 703/2 |
| 5,602,979 A | * | 2/1997 | Loop | 345/423 |
| 6,037,949 A | * | 3/2000 | DeRose et al. | 345/582 |
| 6,356,263 B2 | * | 3/2002 | Migdal et al. | 345/423 |

OTHER PUBLICATIONS

Stam, "Evaluation of Loop Subdivision Surfaces", SIG-GRAPH'99 Course Notes, Aug. 1999, pp. 1–15.*

Mandal et al., "A Novel FEM–Based Dynamic Framework for Subdivision Surfaces", Proceedings of the fifth ACM Symposium on Solid Modeling and Applications, Jun. 1999, pp. 191–202.*

Nasri et al., "An Algorithm for Interpolating Intersecting Curves by Recursive Subdivision Surfaces", Proceedings, Shape Modeling International '99, International Conference on Shape Modeling and Applications, Mar. 1999, pp. 130–137, 274.*

Buchanan, "Schaum's Outline of Theory and Problems of Finite Element Analysis", The McGraw–Hill Companies, Inc., 1995, pp. 210–213 and 229–232.*

Joe Warren, "Subdivision methods for geometric design", Department of Computer Science, Rice University, Nov. 15, 1995.

Jean E. Schweitzer, "Analysis and application of subdivision Surfaces", University of Washington, 1996.

* cited by examiner

Primary Examiner—Jean R. Homere
Assistant Examiner—Herng-der Day
(74) Attorney, Agent, or Firm—Fish & Richardson P.C.

(57) ABSTRACT

Thin-shell finite-element analysis based on the use of subdivision surfaces: (1) describing the geometry of a shell in its undeformed configuration, and (2) generating smooth interpolated displacement fields possessing bounded energy. No nodal rotations are used in the interpolation. The interpolation scheme induced by subdivision is nonlocal, i.e., the displacement field over one element depends on the nodal displacements of the element nodes and all nodes of immediately neighboring elements. However, the use of subdivision surfaces ensures that all local displacement fields thus constructed combine conformingly to define one single limit surface.

9 Claims, 14 Drawing Sheets

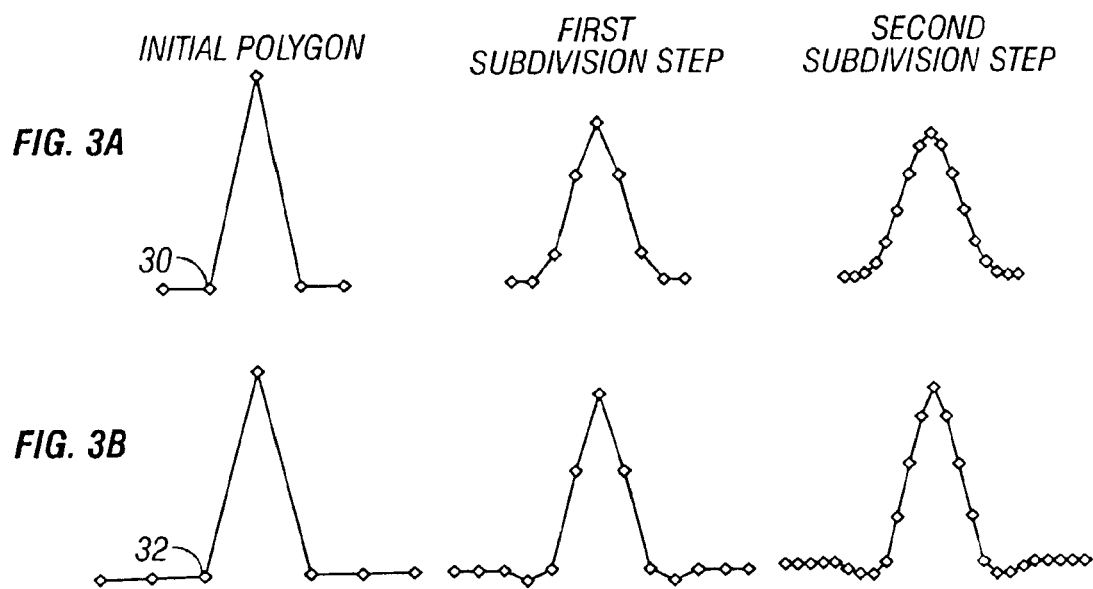
FIG. 3A  
FIG. 3B
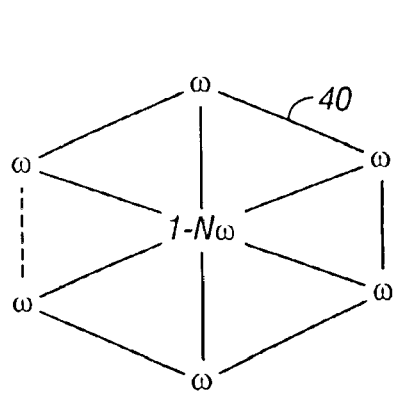
FIG. 4A
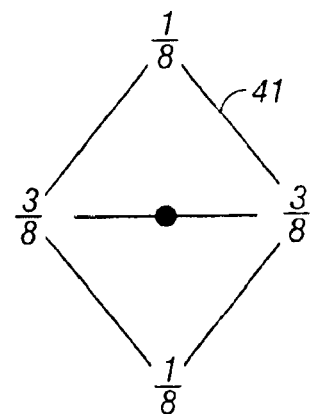
FIG. 4B

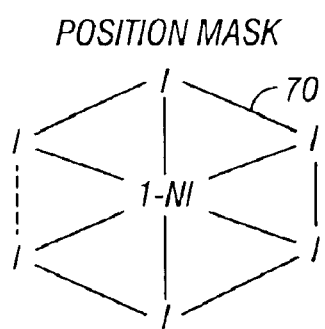 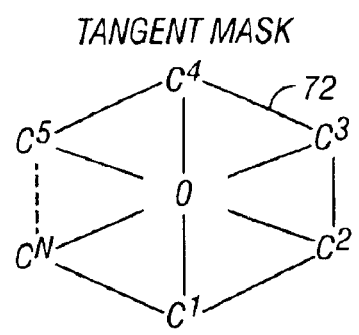 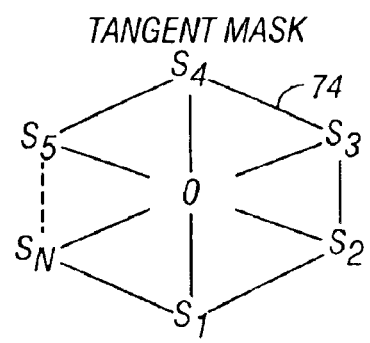
FIG. 7A  FIG. 7B  FIG. 7C
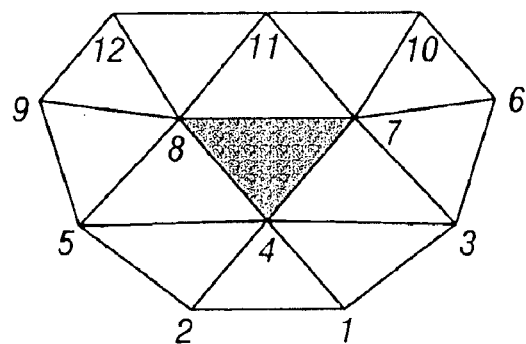
FIG. 8

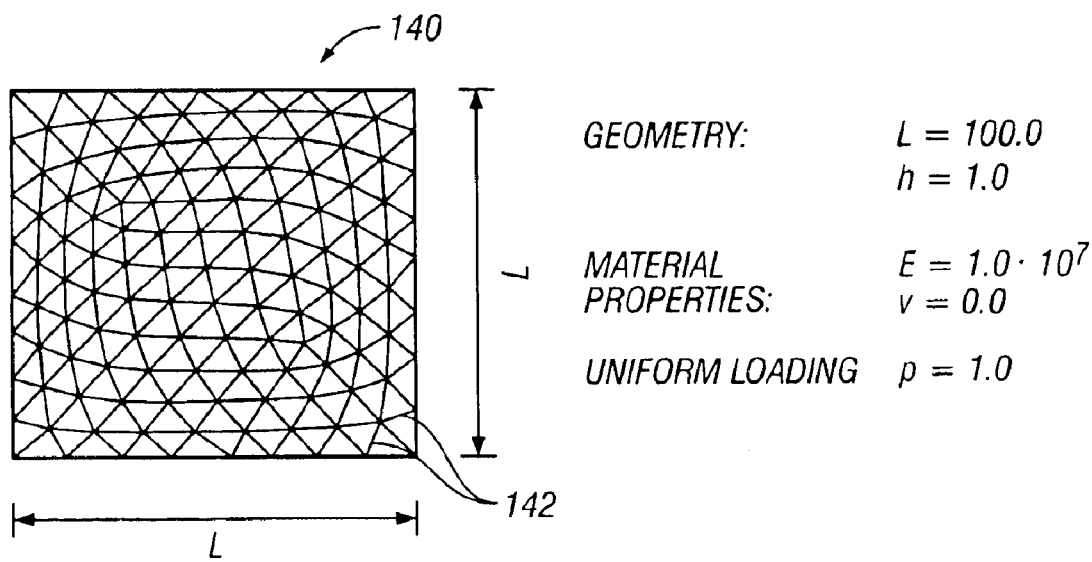
*FIG. 14*
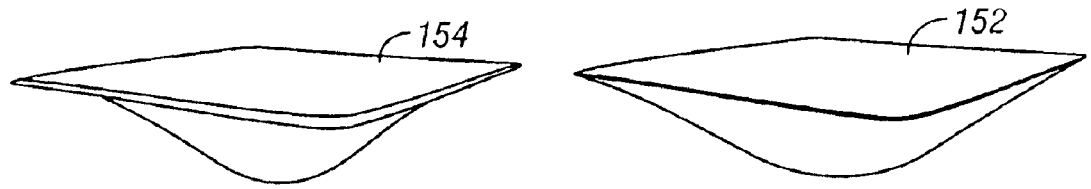
*FIG. 15A*  *FIG. 15B*

GEOMETRY: $L = 600.0$
$R = 300.0$
$h = 3.0$

MATERIAL PROPERTIES: $E = 3.0 \cdot 10^6$
$v = 0.3$

CONCENTRATED FORCES: $F = 1.0$

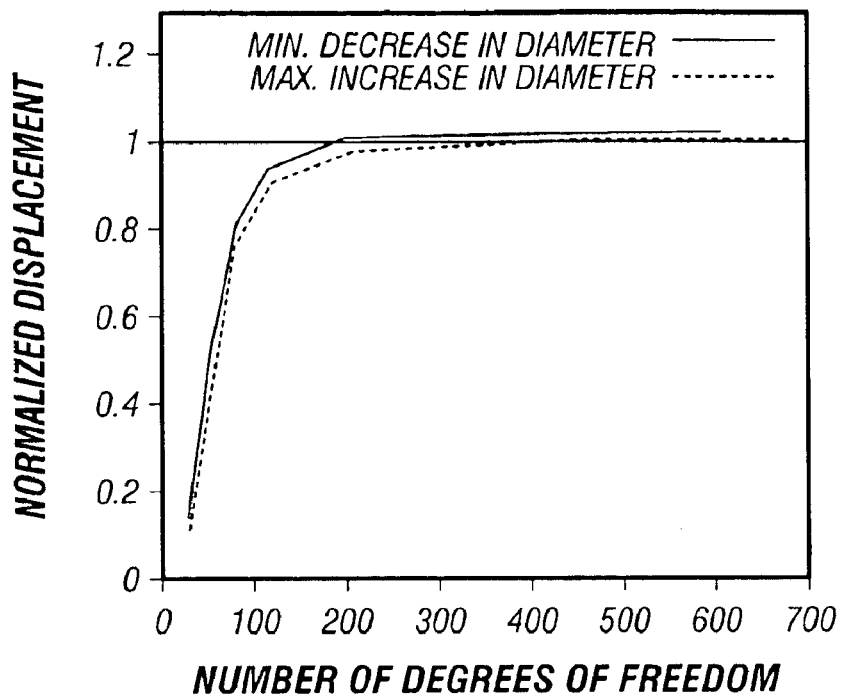
FIG. 21B
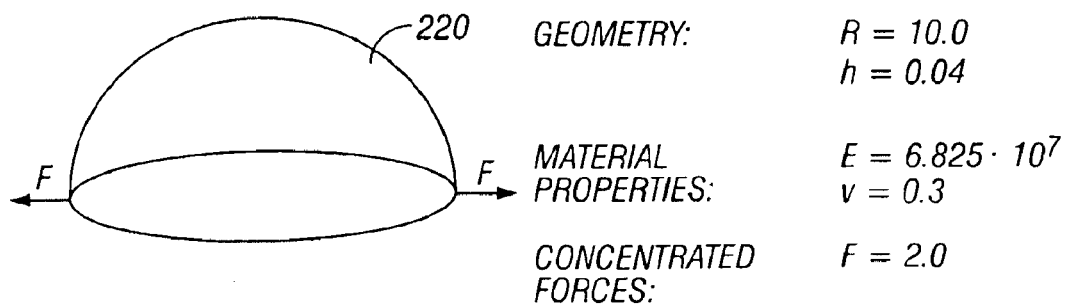
GEOMETRY: $R = 10.0$
$h = 0.04$
MATERIAL PROPERTIES: $E = 6.825 \cdot 10^7$
$v = 0.3$
CONCENTRATED FORCES: $F = 2.0$
FIG. 22A
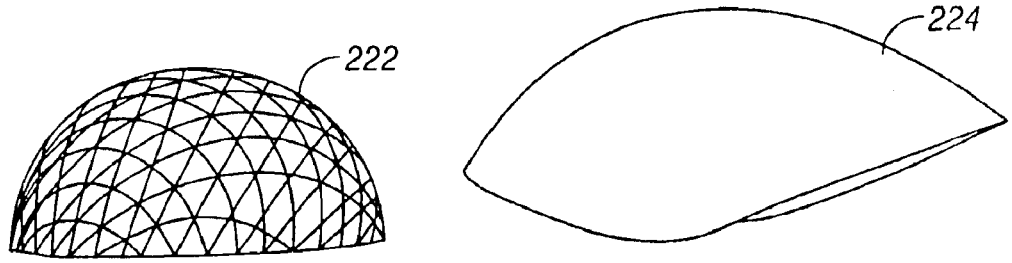
FIG. 22B          FIG. 22C

METHOD AND SYSTEM FOR THIN-SHELL FINITE-ELEMENT ANALYSIS

CLAIM OF PRIORITY

This application claims priority under 35 USC §119(e) to U.S. patent application Ser. No. 60/151,618, filed Aug. 31, 1999, the entire text of which is hereby incorporated by reference.

GOVERNMENT RIGHTS

The U.S. Government may have certain rights in this invention pursuant to Grant Nos. ACI-9624957, ACI-9721349, ASC-8920219 awarded by the National Science Foundation; Grant No. DMS-9875042 awarded to Caltech's OPAAL Project by DARPA and NSF.

TECHNICAL FIELD

This invention relates to computer techniques for performing finite element analysis, and more particularly to novel computer techniques for performing finite element analysis of thin-shell models using subdivision surfaces.

BACKGROUND

The Kirchhoff theory of thin plates and the Kirchhoff-Love theory of thin shells are characterized by energy functionals which depend on curvature, consequently they contain second-order derivatives of displacement. The resulting Euler-Lagrange—or equilibrium—equations in turn take the form of fourth-order partial differential equations. It is well-known from approximation theory that in this context, the convergence of finite-element solutions requires so-called $C^1$ interpolation. More precisely, in order to ensure that the bending energy is finite, the test functions have to be $H^2$, or square-integrable functions whose first- and second-order derivatives are themselves square-integrable. Unfortunately, for general unstructured meshes it is not possible to ensure $C^1$ continuity in the conventional sense of strict slope continuity across finite elements when the elements are endowed with purely local polynomial shape functions and the nodal degrees of freedom consist of displacements and slopes only. Inclusion of higher-order derivatives among the nodal variables leads to well-known difficulties, e.g., the inability to account for stress and strain discontinuities in shells whose properties vary discontinuously across element boundaries, and, owing to the high order of the polynomial interpolation required, the presence of spurious oscillations in the solution.

The difficulties inherent in $C^1$ interpolation have motivated a number of alternative approaches, all of which endeavor to "bear" the $C^1$ continuity requirement. Examples are: quasi-conforming elements obtained by relaxing the strict Kirchhoff constraint; the use of Reissner-Mindlin theories for thick plates and shells (which requires conventional $C^0$ interpolation only); reduced-integration penalty methods; mixed formulations; degenerate solid elements; and many others known from the literature. $C^0$ elements often exhibit poor performance in the thin-shell limit— especially in the presence of severe element distortion. Such distortion may be due to a variety of pathologies such as shear and membrane locking. The proliferation of approaches and the rapid growth of the specialized literature attest to the inherent, perhaps insurmountable, difficulties in vanquishing the $C^1$ continuity requirement.

SUMMARY

The invention includes a method, system, and computer program for performing finite element analysis on a shell based on the use of subdivision surfaces for: (1) describing the geometry of a shell in its undeformed configuration, and (2) generating smooth interpolated displacement fields possessing bounded energy within the strict framework of the Kirchhoff-Love theory of thin shells. The preferred subdivision strategy is Loop's scheme, with extensions to account for creases and displacement boundary conditions. The displacement fields obtained by subdivision are $H^2$ and, consequently, have a finite Kirchhoff-Love energy. The resulting finite elements contain three nodes and element integrals are computer by a one-point quadrature. The displacement field of the shell is interpolated from nodal displacements only. In particular, no nodal rotations are used in the interpolation. The interpolation scheme induced by subdivision is nonlocal, i.e., the displacement field over one element depends on the nodal displacements of the element nodes and all nodes of immediately neighboring elements. However, the use of subdivision surfaces ensures that all the local displacement fields thus constructed combine conformingly to define one single limit surface. Numerical tests, including known obstacle courses of benchmark problems, demonstrate the high accuracy and optimal convergence of the method.

More particular, in one aspect, the invention includes a method, system, and computer program for performing finite element analysis on a shell by the following steps:

Modeling the geometry of the shell using subdivision surfaces.

Characterizing an environment for the shell, including environmental factors affecting the mechanical behavior of the modeled shell (such environment factors includes loading conditions, material properties, and boundary conditions for the modeled shell; the loading conditions may include an indication of applied forces and of thermal loading).

Computing the mechanical response of the modeled shell, taking into account the characterized environment, using a finite element analysis; the finite element analysis preferably uses subdivision basis functions as shape functions, but may in general use any suitably smooth shape function.

Outputting a description of the geometry of the modeled shell as determined from the computed mechanical response (optionally, the output can include outputting indications of the characterized environment).

A specific embodiment of the inventive method for performing finite element analysis using subdivision basis functions can be summarized as follows:

input a mesh comprising a set of data points each having connectivity to neighboring data points, the mesh defining physical parameters;

specify an initial state for the mesh;

define a set of linear differential equations comprising a stiffness matrix and an external forcing vector, at least one such equation having a fourth order differential operator;

solve the set of linear equations as applied to the mesh;

output the solution to the set of linear equations as defining a modification of the initial state of the mesh based on the stiffness matrix and in response to the external forcing vector.

This procedure can be implemented by programming the relevant equations set forth below in light of known techniques for finite element analysis.

The details of one or more embodiments of the invention are set forth in the accompanying drawings and the descrip-

DESCRIPTION OF DRAWINGS

FIG. 3a is a diagram showing a simple one-dimensional example of an approximating subdivision scheme.

FIG. 3b is a diagram showing an interpolating subdivision scheme.

FIG. 4a is a diagram showing a subdivision mask for computing $x_0^1$.

FIG. 4b is a diagram showing a subdivision mask for computing $x_1^1, \ldots x_6^1$.

FIG. 7a is a diagram showing a limit position mask.

FIGS. 7b and 7c are diagrams showing two tangent masks corresponding to the limit position mask shown in FIG. 7a.

FIG. 8 is a graphical example of a regular box-spline patch with 12 control points.

FIG. 14 is a diagram showing an example of a rectangular plate.

FIGS. 15a and 15b are diagrams respectively showing the computed limit surfaces of the simply-supported plate of FIG. 14 and the clamped plate of FIG. 14 following deformation.

FIG. 20b is a diagram showing a typical control mesh for the cylinder of FIG. 20a.

FIGS. 21a and 21b are graphs respectively showing displacement-convergence results for the rigid diaphragm case and the free-end case for the cylinder of FIG. 20a, FIG. 20b, and FIG. 20c.

FIG. 22a is a diagram showing an example of a hemispherical shell.

FIGS. 22b and 22c are diagrams respectively showing a typical control mesh and the corresponding deformed limit surface for the hemispherical shell of FIG. 22a.

Like reference numbers and designations in the various drawings indicate like elements.

DETAILED DESCRIPTION

Introduction

Figure 1:
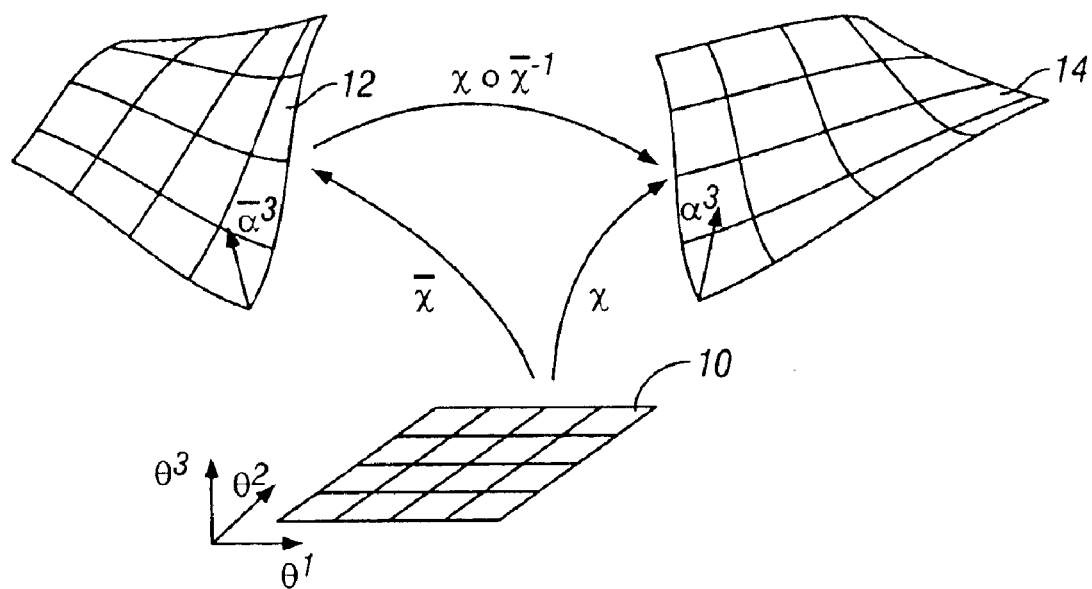
FIG. 1 is a diagram showing a shell geometry in a reference configuration and a deformed configuration.

Simultaneously with the development of $C^0$ plate and shell elements, and for the most part unbeknownst to mechanicians, the field of computer aided geometric design has taken considerable strides towards the efficient generation and representation of smooth surfaces. In particular, the use of subdivision surfaces provides a powerful tool for generating smooth surfaces which either interpolate or approximate an arbitrary collection of points or "nodes". Here, smoothness is understood in the sense of $H^2$ surfaces, i.e., surfaces whose curvature tensor is $L_2$, or square summable. Subdivision surfaces follow as the limit of a recursive refinement of the triangulation of the nodal point set, e.g., by recourse to the classical Loop scheme. Within this framework, the treatment of complex geometries with intersections or curved boundaries is straightforward. Subdivision surfaces obtained by the Loop scheme are guaranteed to be $H^2$, i.e., to have finite bending energy, and are therefore ideally suited as test functions for plate and shell analyses. The smoothness of the limit surface may also be suitably relaxes in the presence of thickness or material discontinuities. The method of subdivision surfaces thus effectively solves the elusive and long-standing $C^1$-interpolation problem which has traditionally plagues plate and shell finite-element analyses. The ready availability of smooth approximating surfaces for arbitrary geometries and triangulations enables a return to the "basic" finite-element method, e.g., the Rayleigh-Ritz method, with the attendant guarantee of optimal convergence.

We teach the subdivision-surface concept as a new paradigm for plate and shell $C^1$ finite-element analyses. We rely on subdivision to generate smooth deformed surfaces from a triangulation of an arbitrary nodal point set. This nodal point set is displaced from that which defines the reference configuration of the shell according to an array of nodal displacements. The nodal displacements are determined as follows. The energy of the deformed plate or shell is given by a direct evaluation of the Kirchhoff or Kirchhoff-Love energy functional. The requisite boundedness of the bending energy is ensured by the $H^2$ property of the test deformed geometries. The equilibrium displacements then follow simply by recourse to energy minimization. Within the framework of linear theories, this process of energy minimization leads to a symmetric and banded system of linear equations for the nodal displacements.

The triangles in the triangulation of the nodal point set may be regarded as three-node finite elements. In particular, the total energy of the shell is the sum of the local energies of the elements. These local energies in turn follow by integration over the domain of the element. However, the interpolation scheme to which the subdivision paradigm leads differs from conventional finite-element interpolation in a crucial respect: the displacement field within an element depends not only on the displacements of the nodes attached to the element but also on the displacements of all the immediately adjacent nodes in the triangulation. Thus, the displacement field within an element is determined by the nodal displacements of a "link" or "patch" of adjacent elements. (However, special rules are required for elements which about on an edge of the shell.) Our approach shares some aspects in common with the finite-volume approach recently proposed by J. Rojek, E. Oriate, and E. Postek, "Application of explicit fe codes to simulation of sheet and bulk metal forming processes," *J. Mater. Process. Techn.*, 80:620–627, 1998 For instance, the patches corresponding to neighboring elements may overlap. However, when the displacement field is constructed by subdivision, as in our approach the displacement representations within the intersection of two patches coincide exactly. Thus, subdivision leads to a unique and well-defined surface over the complete finite-element triangulation, as opposed to a collection of non-conforming local interpolations.

An additional advantage afforded by the present approach is that the geometrical modeling and the finite-element analysis are based on an identical representational paradigm, that is, both the undeformed and the deformed geometries of the plates and shells are described by recourse to subdivision. The prior art has stressed the necessity of a unique framework for both geometric design and mechanical analysis. In contrast, the unification of the geometrical and finite-element representations in accordance with the present invention offers a robust environment which effectively sidesteps many of the difficulties inherent in the currently available software tools, which suffer from heterogeneous and, therefore, error-prone interfaces.

Concisely stated, the invention includes a method, system, and computer program for performing finite element analysis on a shell by the following steps:

(a) Modeling the geometry of the shell using subdivision surfaces.

(b) Characterizing an environment for the shell, including environmental factors affecting the mechanical behavior of the modeled shell (such environment factors includes loading conditions, material properties, and boundary conditions for the modeled shell; the loading conditions may include an indication of applied forces as well as thermal loading).

(c) Computing the mechanical response of the modeled shell, taking into account the characterized environment, using a finite element analysis; the finite element analysis preferably uses subdivision basis functions as shape functions, but may in general use any suitably smooth shape function.

(d) Outputting a description of the geometry of the modeled shell as determined from the computed mechanical response (optionally, the output can include outputting indications of the characterized environment).

The Thin-Shell Boundary Valve Problem

In this section we summarize the field equations for the classical stress-resultant shell model. Here we follow the elegant formulation by Simo et a.l (J. C. Simo and D. D. Fox, "On a stress resultant geometrically exact shell model part i: Formulation and optimal parameterization," *Comput. Methods Appl. Mech. Engrg.*, 72:267–304, 1989; J. C. Simo, D. D. Fox, and M. S. Rifai, "On a stress resultant geometrically exact shell model part ii: The linear theory; computational aspects," *Comput. Methods Appl. Mech. Engrf.*, 73:53–92, 1989) of the Reissner-Mindlin theory, which we specialize to Kirchhoff-Love theory by explicitly constraining the shell director to remain normal to the deformed middle surface of the shell. Throughout the present work we confine our attention to the linear theory of shells under static loading. In Sections below we briefly summarize the relevant aspects of the standard finite-element discretization of the Kirchhoff-Love thin-shell theory.

Kinematics of Deformation

FIG. 1 shows a shell geometry in a reference configuration 12, a deformed configuration 14, and the underlying parameter space 10. The undeformed geometry 12 is characterized by a middle surface of domain $\square$ and boundary $\square=\partial\square$. For simplicity we assume throughout that the thickness h of the shell is uniform. The undeformed shell 12 deforms under the action of applied loads (which may include thermal loading) and adopts a deformed configuration 14, characterized by a middle surface of domain $\Omega$ and $\Gamma=\partial\Omega$.

The position vectors $\bar{r}$ and $r$ of a material point in the reference 12 and deformed configurations 14 of the shell may be parameterized in terms of a system $\{\theta^1, \theta^2, \theta^3\}$ of curvilinear coordinates as:

$$\bar{r}(\theta^1, \theta^2, \theta^3) = \bar{x}(\theta^1, \theta^2) + \theta^3 \bar{a}_3(\theta^1, \theta^2), \quad -\frac{h}{2} \leq \theta^3 \leq \frac{h}{2} \quad (1)$$

$$r(\theta^1, \theta^2, \theta^3) = x(\theta^1, \theta^2) + \theta^3 a_3(\theta^1, \theta^2), \quad -\frac{h}{2} \leq \theta^3 \leq \frac{h}{2} \quad (2)$$

The functions $\bar{x}(\theta^1,\theta^2)$ and $x(\theta^1,\theta^2)$ furnish a parametric representation of the middle surface in the reference 12 configuration and deformed configuration 14. The corresponding surface basis vectors are:

$$\bar{a}_\alpha = \bar{x}_{1\alpha}, \quad a_\alpha = x_{1a} \quad (3)$$

where here and henceforth Greek indices take the values 1 and 2, and a comma is used to denote partial differentiation. The covariant components of the surface metric tensors in turn follow as:

$$\bar{a}_{\alpha\beta} = \bar{a}_\alpha \cdot \bar{a}_\beta, \quad a_{\alpha\beta} = a_\alpha \cdot a_\beta \quad (4)$$

whereas the covariant components of curvature tensors are:

$$\bar{\kappa}_{\alpha\beta} = \bar{a}_\alpha \cdot \bar{a}_{3,\beta}, \quad \kappa_{\alpha\beta} = a_\alpha \cdot a_{3,\beta} \quad (5)$$

For later reference we also introduce the contravariant components of the undeformed and deformed surface metric tensors, $\bar{a}^{\alpha\beta}$ and $a^{\alpha\beta}$, respectively. The defining property of these components is:

$$\bar{a}^{\alpha\gamma}\bar{a}_{\gamma\beta} = \delta_\beta^\alpha, \quad a^{\alpha\gamma}a_{\gamma\beta} = \delta_\beta^\alpha \quad (6)$$

We also note that the element of area over $\square$ follows as $$d\bar{\Omega} = \sqrt{\bar{a}}d\theta^1 d\theta^2 \quad (7)$$

where $$\sqrt{\overline{+e,\text{ovs}}}\,\overline{a}+ee =|\overline{a}_1\times\overline{a}_2| \quad (8)$$

is the jacobian of the surface coordinates $\{\theta^1, \theta^2\}$.

The shell director $\overline{\alpha}_3$ in the reference configuration 12 coincides with the normal to the undeformed middle surface of the shell and hence has the properties:

$$\overline{a}_\alpha \cdot \overline{a}_3 = 0, \quad |\overline{a}_3| = 1 \quad (9)$$

which give $\overline{\alpha}_3$ explicitly in the form:

$$\overline{a}_3 = \frac{\overline{a}_1 \times \overline{a}_2}{|\overline{a}_1 \times \overline{a}_2|} \quad (10)$$

For the moment we allow the director $\alpha_3$ on the deformed configuration 14 of the shell to be an arbitrary vector field.

The covariant base vectors in the reference and the current configuration 12, 14 follow simply as:

$$\overline{g}_\alpha = \frac{\partial \overline{r}}{\partial \theta^\alpha} = \overline{a}_\alpha + \theta^3 \overline{a}_{3,\alpha}, \quad \overline{g}_3 = \frac{\partial \overline{r}}{\partial \theta^3} = \overline{a}_3 \quad (11)$$

$$g_\alpha = \frac{\partial r}{\partial \theta^\alpha} = a_\alpha + \theta^3 a_{3,\alpha}, \quad g_3 = \frac{\partial r}{\partial \theta^3} = a_3 \quad (12)$$

The corresponding covariant components of the metric tensors in both configurations are:

$$\overline{g}_{ij} = \overline{g}_i \cdot \overline{g}_j, \quad g_{ij} = g_i \cdot g_j \quad (13)$$

where here and henceforth lowercase Latin indices take the values 1, 2, and 3.

The Green-Lagrange strain tensor is defined as the difference between the metric tensors on the deformed and undeformed configurations of the shell, i.e., $$E_{ij} = \frac{1}{2}(g_{ij} - \overline{g}_{ij}) \quad (14)$$

Using Eqs. 11, 12, and 13, the Green-Lagrange strain of the shell is found to be of the form:

$$E_{ij} = \alpha_{ij} + \theta^3 \beta_{ij} \quad (15)$$

to first order in the shell thickness h. The nonzero components of the tensors $\alpha_{ij}$ and $\beta_{ij}$ are in turn related to the deformation of the shell as follows:

$$\alpha_{ij} = \frac{1}{2}(a_i \cdot a_j - \overline{a}_i \cdot \overline{a}_j) \quad (16)$$

$$\beta_{\alpha\beta} = a_\alpha \cdot a_{3,\beta} - \overline{a}_\alpha \cdot \overline{a}_{3,\beta} \quad (17)$$

In particular, the in-plane components $\alpha_{\alpha\beta}$, or membrane strains, measure the straining of the surface; the components $\alpha_{\alpha 3}$ measure the shearing of the director $\overline{a}_3$; the component $\alpha_{33}$ measures the stretching of the director; and the components $\beta_{\alpha\beta}$, or bending strains, measure the bending or change in curvature of the shell, respectively.

The above kinematic relations allow for finite deformations as well as for shearing and stretching of the shell director. In the remainder of this description, we restrict our attention to the Kirchhoff-Love theory of thin shells and, accordingly, we constrain the deformed director $\alpha_3$ to coincide with the unit normal to the deformed middle surface of the shell, i.e., $$\alpha_\alpha \cdot \alpha_3 = 0, \quad |\alpha_3| = 1 \quad (18)$$

which yields:

$$a_3 = \frac{a_1 \times a_2}{|a_1 \times a_2|} \quad (19)$$

Owing to these constraints, the shear strains $\alpha_{\alpha 3}$ vanish identically and the bending strains simplify to:

$$\beta_{\alpha,\beta} = \overline{a}_{\alpha,\beta} \cdot \overline{a}_3 - \alpha_{\alpha,\beta} \cdot \alpha_3 \quad (20)$$

It follows from these relations that, by virtue of the assumed Kirchhoff-Love kinematics, all the strain measures of interest may be deduced from the deformation of the middle surface of the shell.

For simplicity, we restrict the scope of subsequent discussions to linearized kinematics. To this end, we begin by writing $$x(\theta^1,\theta^2) = \overline{x}(\theta^1,\theta^2) + u(\theta^1,\theta^2) \quad (21)$$

where $u(\theta^1,\theta^2)$ is the displacement field of the middle surface of the shell. To first order in u the membrane and bending strains then follows as:

$$\alpha_{\alpha\beta} = \frac{1}{2}(\overline{a}_\alpha \cdot u_{,\beta} + u_{,\alpha} \cdot \overline{a}_\beta) \quad (22)$$

$$\beta_{\alpha\beta} = -u_{,\alpha\beta} \cdot \overline{a}_3 + \frac{1}{\sqrt{\overline{a}}}[u_{,1} \cdot (\overline{a}_{\alpha,\beta} \times \overline{a}_2) + u_{,2} \cdot (\overline{a}_1 \times \overline{a}_{\alpha,\beta})] + \quad (23)$$

$$\frac{\overline{a}_3 \cdot \overline{a}_{\alpha,\beta}}{\sqrt{\overline{a}}}[u_{,1} \cdot (\overline{a}_2 \times \overline{a}_3) + u_{,2} \cdot (\overline{a}_3 \times \overline{a}_1)]$$

It is clear from these expressions that the displacement field u of the middle surface furnishes a complete description of the deformation of the shell and may therefore be regarded as the primary unknown of the analysis. It also follows that the deformed and undeformed domains $\Omega$ and $\square$ are indistinguishable to within the order of approximation of the linearized theory and, in consequence, we drop the distinction between the two domains throughout the remainder of this description.

Equilibrium Deformations of Elastic Shells

Next, we seek to characterize the equilibrium configurations of the shell by recourse to energy principles. For simplicity, we shall assume throughout that the shell is linear elastic with a strain energy density per unit area of the form:

$$W(\alpha,\beta) = \frac{1}{2}\frac{Eh}{1-v^2}H^{\alpha\beta\gamma\delta}\alpha_{\alpha\beta}\alpha_{\gamma\delta} + \frac{1}{2}\frac{Eh^3}{12(1-v^2)}H^{\alpha\beta\gamma\delta}\beta_{\alpha\beta}\beta_{\gamma\delta} \quad (24)$$

where E is Young's modulus, v is Poisson's ratio, and $$H^{\alpha\beta\gamma\delta} = v\overline{a}^{\alpha\beta}\overline{a}^{\gamma\delta} + \frac{1}{2}(1-v)(\overline{a}^{\alpha\gamma}\overline{a}^{\beta\delta} + \overline{a}^{\alpha\delta}\overline{a}^{\beta\gamma}) \qquad (25)$$

In Eq. 24, the first term is the membrane strain energy density and the second term is the bending strain energy density. The membrane and bending stresses follow from Eq. 24 by work conjugacy, with the result:

$$n^{\alpha\beta} = \frac{\partial W}{\partial \alpha_{\alpha\beta}} = \frac{Eh}{1-v^2} H^{\alpha\beta\gamma\delta} \alpha_{\gamma\delta} \qquad (26)$$

$$m^{\alpha\beta} = \frac{\partial W}{\partial \beta_{\alpha\beta}} = \frac{Eh^3}{12(1-v^2)} H^{\alpha\beta\gamma\delta} \beta_{\gamma\delta} \qquad (27)$$

The membrane and bending stress tensors $n^{\alpha\beta}$ and $m^{\alpha\beta}$ may be given a direct mechanistic interpretation as force and moment resultants.

The shell is subject to a system of external dead loads consisting of distributed loads q per unit area of $\Omega$ and axial forces N per unit length of $\Gamma$. Under these conditions the potential energy of the shell takes the form:

$$\Phi[u] = \Phi^{int}[u] + \Phi^{ext}[u] \qquad (28)$$

where $$\Phi^{int}[u] = \int_\Omega W(\alpha, \beta) d\Omega \qquad (29)$$

is the elastic potential energy and $$\Phi^{ext}[u] = -\int_\Omega q \cdot u d\Omega - \int_\Gamma N \cdot u ds \qquad (30)$$

is the potential energy of the applied loads.

The stable equilibrium configurations of the shell now follow from the principle of minimum potential energy:

$$\Phi[u] = \inf_{v \in V} \Phi[v] \qquad (31)$$

where V is the space of solutions consisting of all trial displacement fields v with finite energy $\Phi[v]$. It is clear from the form of the elastic energy of the shell that such trial displacement fields must necessarily have square integrable first and second derivatives. Within the context of the linear theory, and under suitable technical restrictions on the domain $\Omega$ and the applied loads, it therefore follows that V may be identified with the Sobolev space of functions $H^2(\Omega, R^3)$. In particular, an acceptable finite-element interpolation method must guarantee that all trial finite element interpolants belong to this space.

The Euler-Lagrange equations corresponding to the minimum principle (Eq. 31) may be expressed in weak form as:

$$\langle D\Phi[u], \delta u \rangle = \langle D\Phi^{int}[u], \delta u \rangle + \langle D\Phi^{ext}[u], \delta u \rangle = 0 \qquad (32)$$

which is a statement of the principle of virtual work. Here $\langle D\Phi[u], \delta u \rangle$ denotes the first variation of $\Phi$ at u in the direction of the virtual displacements $\delta u$.

$$\langle D\Phi^{int}[u], \delta u \rangle = \int_\Omega [n^{\alpha\beta} \delta\alpha_{\alpha\beta} + m^{\alpha\beta} \delta\beta_{\alpha\beta}] d\Omega \qquad (33)$$

in the internal virtual work and $$\langle D\Phi^{ext}[u], \delta u \rangle = -\int_\Omega q \cdot \delta u d\Omega - \int_\Gamma N \cdot \delta u ds \qquad (34)$$

is the external virtual work. The minimum principle (Eq. 31) or, equivalently, the virtual work principle (Eq. 32) are subsequently taken as a basis for formulating finite-element approximations to the equilibrium configuration of the shell.

Finite-Element Discretization

We now turn to the finite-element discretization of the potential energy of the shell (Eq. 28) or, equivalently, its first variation (Eq. 32). To this end, it proves convenient to adopt Voigt's notation and map symmetric second-order tensors into arrays by recourse to the conventions:

$$n = \begin{pmatrix} n^{11} \\ n^{22} \\ n^{12} \end{pmatrix} \quad m = \begin{pmatrix} m^{11} \\ m^{22} \\ m^{12} \end{pmatrix} \quad \alpha = \begin{pmatrix} \alpha_{11} \\ \alpha_{22} \\ 2\alpha_{12} \end{pmatrix} \quad \beta = \begin{pmatrix} \beta_{11} \\ \beta_{12} \\ 2\beta_{12} \end{pmatrix} \qquad (35)$$

The constitutive relations, Eqs. 26 and 27, may similarly be written in the form:

$$n = \frac{Eh}{1-v^2} H\alpha \qquad (36)$$

$$m = \frac{Eh^3}{12(1-v^2)} H\beta \qquad (37)$$

where we write:

$$H = \qquad (38)$$

$$\begin{pmatrix} (\overline{a}^{11})^2 & v\overline{a}^{11}\overline{a}^{22} + (1-v)(\overline{a}^{12})^2 & \overline{a}^{11}\overline{a}^{12} \\ & (\overline{a}^{22})^2 & \overline{a}^{22}\overline{a}^{12} \\ \text{sym.} & & \frac{1}{2}[(1-v)\overline{a}^{11}\overline{a}^{22} + (1+v)(\overline{a}^{12})^2] \end{pmatrix}$$

which replaces Eq. 25 within the Voigt formalism. Using these conventions, the internal virtual work (Eq. 33) may be recast in the convenient form $$\langle D\Phi^{int}[u], \delta u \rangle = \int_\Omega \left[ \frac{Eh}{1-v^2} \delta\alpha^T H\alpha + \frac{Eh^3}{12(1-v^2)} \delta\beta^T H\beta \right] d\Omega \qquad (39)$$

Next we proceed to partition the domain $\Omega$ of the shell into a finite element mesh, the precise nature of which will remain unspecified for now. The collection of element domains in the mesh is $\{\Omega_K, K=1, \ldots, NEL\}$, where $\Omega_K$ denotes the domain of element K and NEL is the total number of elements in the mesh. The finite-element mesh may be taken as a basis for introducing a displacement interpolation of the general form:

$$u_h(\theta^1, \theta^2) = \sum_{I=1}^{N} N^I(\theta^1, \theta^2) u_I \quad (40)$$

where $\{N^I, I=1, \ldots, N\}$ are the shape functions, $\{u_1, I=1, \ldots, N\}$ are the corresponding nodal displacements, and N is the number of nodes in the mesh. Owing to the linearity of the dependence of the finite-element interpolant $u_h$ on the nodal displacements, an application of Eq. 22 and Eqs. 23 to 40 gives the finite-element membrane and bending strains in the form:

$$\alpha_h(\theta^1, \theta^2) = \sum_{I=1}^{N} M^I(\theta^1, \theta^2) u_I \quad (41)$$

$$\beta_h(\theta^1, \theta^2) = \sum_{I=1}^{N} B^I(\theta^1, \theta^2) u_I \quad (42)$$

for some matrices $M^I$ and $B^I$. The precise form of these matrices is given in Appendix A.0.3 below. Finally, the introduction of Eqs. 40, 41, and 42 into the principle of virtual work (Eq. 32) yields the equations of equilibrium for the nodal displacements:

$$K_h u_h = f_h \quad (43)$$

where, by a slight abuse of notation, we take $u_h$ to signify the array of nodal displacements, $$K_h^{IJ} = \quad (44)$$

$$\sum_{K=1}^{NEL} \int_{\Omega_K} \left[ \frac{Eh}{1-\nu^2}(M^I)^T H M^J + \frac{Eh^2}{12(1-\nu^2)}(B^I)^T H B^J \right] d\Omega \equiv \sum_{K=1}^{NEL} K_K^{IJ}$$

is the stiffness matrix, and $$f_h^J = \sum_{K=1}^{NEL} \left\{ \int_{\Omega_K} q N^I d\Omega + \int_{\Gamma_K \cap \Gamma} \overline{N} N^I ds \right\} \equiv \sum_{K=1}^{NEL} f_K^I \quad (45)$$

is the nodal force array. It should be carefully noted that, as expected, the global stiffness and force arrays just defined follow by the assembly of low-dimensionality element stiffness and force arrays $K_K^{IJ}$ and $f_K^i$, respectively, as is standard in the finite-element method.

The computation of element arrays requires the evaluation of integrals extended to the domain of each element, cf. Eqs. 44, 45. These integrals may efficiently be evaluated by recourse to numerical quadrature without compromising the order of convergence. For instance, the application of a quadrature rule to the calculation of the element stiffness matrices leads to the expression:

$$K_K^{IJ} = \sum_{G=1}^{NQ} \left[ \frac{Eh}{1-\nu^2}(M^I)^T H M^J + \frac{Eh^3}{12(1-\nu^2)}(B^I)^T H B^J \right]_{(\theta_G^1, \theta_G^2)} \sqrt{a(\theta_G^1, \theta_G^2)} w_G \quad (46)$$

where $(\theta_G^1, \theta_G^2)$ are the quadrature points, $w_G$ are the corresponding quadrature weights, and NQ is the number of quadrature points in the rule. The element force arrays $f_k^I$ may be computed likewise.

Sufficient conditions for the quadrature rule to preserve the order of convergence of the finite-element method may be found in G. Strang and G. J. Fix, *An Analysis of the Finite Element Method*, Prentice-Hall, Englewood Cliffs, N.J., 1973. In general, this conditions demand that certain shape function derivatives be computed exactly and, consequently, place a lower bound on the order NQ of the quadrature rule. These theoretical considerations and our numerical tests show that a one-point quadrature rule is sufficient to compute all element arrays of interest.

Subdivision Surfaces and Finite-Element Interpolation

It is clear from the preceding developments that the central problem in thin-shell finite-element analysis is the formulation of shape functions $N^I$ which are $H^2$ (or "$C^1$" in the usual finite-element terminology), as this property ensures the finiteness of the energy of the trial displacement fields. In this section we develop one such interpolation scheme based on the notion of subdivision surface.

Subdivision Surfaces

We begin by reviewing the essential ideas behind subdivision surfaces using one-dimensional examples first, then moving to the two-dimensional manifold (with boundary) setting relevant to shells. Here we limit ourselves to reviewing various elementary properties of subdivision.

Throughout this discussion the term vertex will be used to refer to nodes in the mesh. For example, a vertex has associated with it a particular nodal position. A vertex has a topological neighborhood defined by the structure of the mesh. For example, its 1-ring neighbors are all those vertices which share an edge with it (and recursively for its k-ring). This distinction between vertices and nodal positions is typically not needed when dealing with finite elements, but it is important to keep these distinctions in mind when dealing with smooth subdivision.

Figure 2:
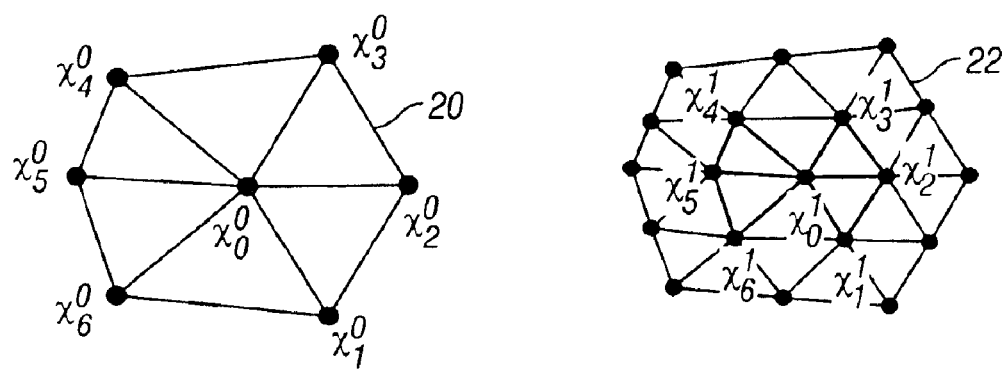
FIG. 2 is a diagram showing graphically depicting refinement of a coarse triangular mesh to a finer mesh by quadrisection.

At the highest level of description we may say that subdivision schemes construct smooth surfaces through a limiting procedure of repeated refinement starting from an initial mesh. This initial mesh will also be referred to as the control mesh of the surface. Generally, subdivision schemes consist of two steps. First the mesh is refined, e.g., all faces are quadrisected, followed by the computation of new nodal positions. These positions are simple, linear functions of the nodal positions of the coarser mesh. See FIG. 2, which graphically depicts refinement of a coarse triangular mesh 20 to a finer mesh 22 by quadrisection. For the schemes of interest these computations are local, i.e., they involve only nodal positions of the coarser mesh within a small, finite topological neighborhood, leading to very efficient implementations. Using a suitable choice of weights, such subdivision schemes can be designed to produce a smooth surface in the limit. Subdivision methods which result in limit surfaces whose curvature tensor is square integrable are especially appealing for geometrical modeling applications and for the purpose of thin-shell analysis.

Many subdivision schemes have been proposed and studied extensively in the mathematical geometric modeling literature. The methods can be separated into two groups.

Interpolating Schemes: The nodal positions of the coarser mesh are fixed, while only the nodal positions of new vertices are computed when going from a coarser to a finer mesh. Consequently, the nodal positions of the initial mesh, as well as any nodes produced during subdivision, interpolate the limit surface. Interpolating schemes exist for quadrilateral meshes and for triangular meshes. In both cases, the limit surfaces are $C^1$ but their curvatures do not exist.

Therefore, these schemes are not suitable for the special application of thin-shell analysis.

Approximating Schemes: These schemes compute both new nodal positions for the newly created vertices, as well as for the vertices inherited from the coarser mesh, i.e., those which already carried nodal positions. Consequently, the nodal positions of the initial mesh are not samples of the final surface. The schemes of Catmull-Clark (E. Catmull and J. Clark, "Recursively generated b-spline surfaces on arbitrary topological meshes," *Comput. Aided Design,* 10(6):350–355, 1978) and Doo-Sabin (D. Doo and M. Sabin, "Behaviour of recursive division surfaces near extraordinary points," *Comput. Aided Design,* 10(6):356–360, 1978) fall into this class and operate on quadrilateral meshes. An approximating scheme for triangular meshes introduced by Loop (C. Loop, "Smooth subdivision surfaces based on triangles," Master's thesis, University of Utah, Department of Mathematics, 1987) is used in the present work. Loop's scheme produces limit surfaces which are globally $C^2$ except at a number of isolated points where they are only $C^1$. However, their principal curvatures are square integrable, making them good candidates for thin-shall analysis.

FIG. 3a shows a simple one-dimensional example of an approximating scheme 30. FIG. 3b shows an interpolating scheme 32. Both figures graphically show two subdivision steps based on an initial polygon. We assume that the polygon with the nodes $x_I^k$ is the result of subdivision step k. In the subsequent refinement k+1 for the approximating scheme 30, a new vertex gets a nodal position $x_{2I+1}^{k+1}$ which is the average of its two neighboring nodes $x_I^k$ and $x_{I+1}^k$:

$$x_{2I+1}^{k+1} = \frac{1}{2}(x_I^k + x_{I+1}^k) \qquad (47)$$

The nodal positions of the existing vertices are recomputed as $$x_{2I}^{k+1} = \frac{1}{8}(x_{I-1}^k + 6x_I^k + x_{I+1}^k) \qquad (48)$$

Since throughout the subdivision process all nodal positions are recomputed as weighted averages of nearby vertices, the resulting scheme does not interpolate the nodal positions of the control mesh, but rather approximates them.

In contrast, the interpolating scheme 32 does not modify the coordinates of nodes existing at the previous refinement level:

$$x_{2I}^{k+1} = x_I^k \qquad (49)$$

Only the newly generated vertices receive new nodal coordinates:

$$x_{2I+1}^{k+1} = \frac{1}{16}(-x_{I-1}^k + 9x_I^k + 9x_{I+1}^k - x_{I+2}^k) \qquad (50)$$

Repeating this process ad infinitum leads to smooth curves. In the case of the approximating scheme 30, these curves are actually cubic splines which are $C^2$ continuous. On the other hand, the interpolating scheme 32 is known as the 4pt scheme, and it can be shown that the resulting curves are $C^{2-6}$ continuous. Since the entire subdivision process is linear, the resulting limit curves (or surfaces) are linear combinations of basis functions (sometimes referred to as "fundamental solutions" of the subdivision process). The compact support of the subdivision rules ensures that the basis functions are compactly supported as well. For the approximating scheme 30, this support extends two vertices to the left and two vertices to the right (and hence is a 2-ring), while the 4pt scheme has a support covering three vertices to each of the left and right (and hence is a 3-ring). Both schemes belong to the class of regular subdivision schemes since the weights are the same for every vertex and every level. In the two-dimensional case, we will see that the weights will depend on the valence, i.e., the number of edges attached to a vertex, but are otherwise the same from level to level. These rules are also referred to as semi-regular. Similarly one can adapt the rules to non-smooth features such as boundaries or creases, as well as other boundary conditions, using known techniques.

In the one-dimensional case, subdivision schemes do not offer an important advantage since curves of the desired smoothness are easy to construct with traditional approaches such as Hermitian interpolation. In the two-dimensional, arbitrary-topology manifold setting, by contrast, subdivision methods offer significant advantages over other methods of smooth-surface construction. In fact, their original invention was motivated by the difficulties of constructing smooth-surface models of arbitrary-topology. For example, it is well known that $C^2$ arbitrary-topology surfaces built with traditional patches require up to sixth-order polynomials, leading to cumbersome computations and difficult-to-manage cross-patch continuity conditions. Additionally, the resulting degrees of freedom often lack physical meaning. However, in the subdivision setting, the only degrees of freedom are the nodal positions and the resulting surfaces are guaranteed to be smooth without the need to enforce cross-patch continuity conditions.

In the following sections we introduce the refinement rules used in Loop's subdivision scheme for surfaces, and, based on the concept of the subdivision matrix, briefly discuss the basic ideas behind the scheme's smoothness analysis. This discussion will serve to prepare the way for the parameterization of subdivision surfaces needed for the evaluation of positions, tangents, and curvatures. In particular, it is possible to evaluate these quantities exactly through the use of eigenanalysis without going to the limit. While we focus on Loop's scheme, the basic ideas and machinery apply equally well to other subdivision schemes. In particular, the Catmull-Clark scheme, with quadrilateral elements, is a promising alternative for finite-element computations, since quadrilateral elements generally perform relatively better for very coarse meshes.

Refinement Rules

In Loop's subdivision scheme, the control mesh and all refined meshes consist of triangles only. These are preferably refined by quadrisection (see FIG. 2). After the refinement step, the nodal positions of the refined mesh are computed as weighted averages of the nodal positions of the unrefined mesh. We distinguish two cases: new vertices associated with the edges of the coarser mesh, and old vertices of the coarse mesh.

The coordinates of the newly generated nodes $x_1^I, x_2^I, x_3^I,$ . . . on the edges of the previous mesh are computed as:

$$x_I^{k+1} = \frac{3x_0^k + x_{I-1}^k + 3x_I^k + x_{I+1}^k}{8} \quad I = 1, \ldots, N \qquad (51)$$

whereby index I is to be understood in modulo arithmetic. The old vertices get new nodal positions according to:

$$x_0^{k+1} = (1-Nw)x_0^k + wx_1^k + \ldots + wx_N^k \qquad (52)$$

where $x^k$ are the nodal positions of the mesh at level k and $x^{k+1}$ are the respective positions for the mesh k+1. The valence of the vertex, i.e., the number of edges incident on it, is denoted by N. Note that all newly generated vertices have valence 6 while only the vertices of the original mesh may have valence other than 6. We will refer to the former case (valence=6) as regular and to the latter case as irregular. Equations 51 and 52 are depicted in symbolic forms in FIGS. 4a and 4b as so-called subdivision masks 40, 41. FIG. 4a shows a subdivision mask 40 for computing $x_0^1$ as a function of a parameter w. FIG. 4b shows a subdivision mask 41 for computing $x_1^1, \ldots x_6^1$.

As this stage it is not obvious how to choose the parameter w for the subdivision mask 40 to get $C^1$ continuous surfaces. In the original scheme Loop proposed $$w = \frac{1}{N}\left[\frac{5}{8} - \left(\frac{3}{8} + \frac{1}{4}\cos\frac{2\pi}{N}\right)^2\right]. \tag{53}$$

As it turns out, other values for w also give smooth surfaces. For example, Warren's (J. Warren, "Subdivision methods for geometric design," Unpublished manuscript, Department of Computer Science, Rice University, November 1995) choice for w is simpler to evaluate than that of Equation 53:

$$w = \frac{3}{8N} \text{ for } N > 3 \quad w = \frac{3}{16} \text{ for } N = 3 \tag{54}$$

Although the choice for the weights appears somewhat arbitrary, the motivation for this choice will be discussed in the next section. In any case, the weights used by the subdivision scheme depend only on the connectivity of the mesh and are independent of the nodal positions.

Figure 5:
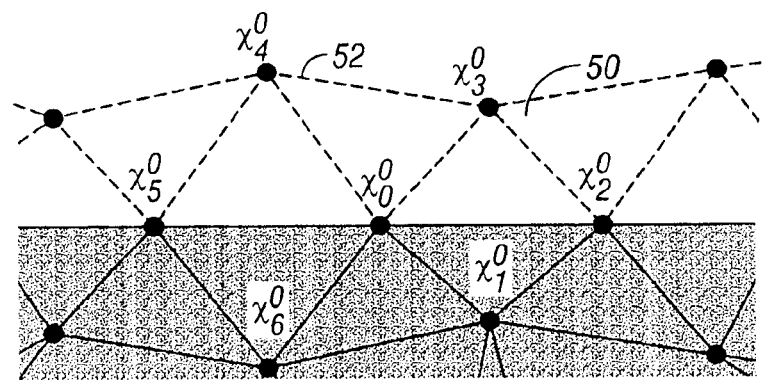
FIG. 5 is a diagram showing a graphical example of a boundary approximation using temporary vertices.

So far we have ignored the boundary of the mesh, where the subdivision rules need to be modified. Two choices are possible here. The first method considers the boundary as a one-dimensional curve and applies the rules of Eqs. 47 and 48 to any vertices on the boundary. Another method for the treatment of boundaries, which we employ in our implementation, was proposed by Schweitzer (J. E. Schweitzer, *Analysis and Application of Subdivision Surfaces*, Ph.D. dissertation, Department of Computer Science and Engineering, University of Washington, Seattle, 1996). For each boundary edge, one temporary or artificial vertex is defined, after which the ordinary rules are applied. FIG. 5 gives a graphical example of a boundary approximately using temporary vertices 50, 52. The nodal positions of the temporary vertices 50, 52 are set to:

$$x_3^0 = x_0^0 + x_2^0 - x_1^0 \text{ and } x_4^0 = x_0^0 + x_5^0 - x_6^0. \tag{55}$$

This particular choice of temporary vertices effectively reproduces the one-dimensional subdivision rules.

Figure 6:
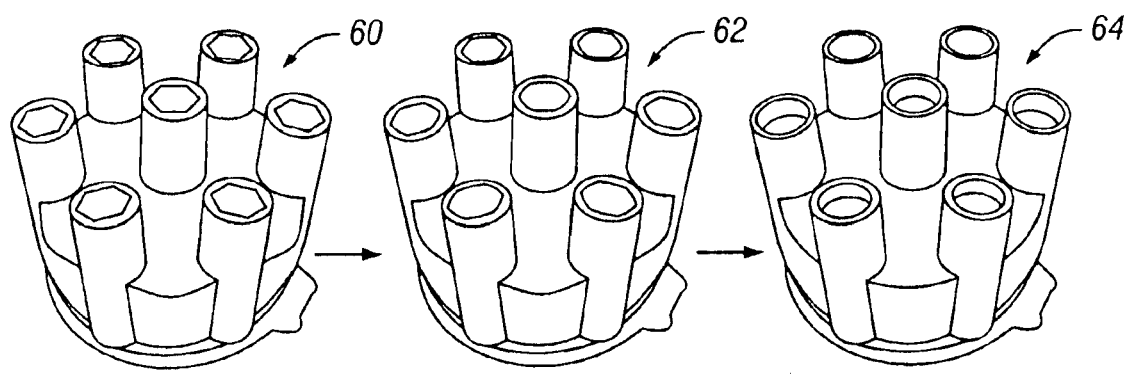
FIG. 6 is a diagram showing an example of a geometrically complex shape (a distributor cap), demonstrating the ability of subdivision surfaces to model intricate shapes in a straightforward fashion.

This simplified boundary treatment with temporary vertices leads to approximation errors for corners and boundary vertices with valence other than 4. However, these errors do not inhibit the convergence of the finite-element method. For modeling surfaces with creases or shell intersections, the edge rules can also be applied within the mesh on appropriately tagged edges. FIG. 6 shows an example of a geometrically more complex shape (a distributor cap) using such crease rules, demonstrating the ability of subdivision surfaces to model intricate shapes in a straightforward fashion. The entire shape is a single, piecewise smooth surface. In this example, the original control mesh 60 is chosen to be least-squares optimal in terms of geometric approximately fidelity. FIG. 6 also shows a subdivided mesh 62 and the limit surface 64.

Convergence and Smoothness

Subdivision methods for arbitrary-topology surfaces were introduced more than 20 years ago, but not widely used in applications until the early 1990s when theoretical breakthroughs put their convergence and smoothness analysis on a solid mathematical foundation. If all vertices are regular (valence 6 for triangles or valence 4 for rectangular schemes), powerful Fourier methods can be used to establish smoothness properties. However, these techniques do not apply in the arbitrary-topology manifold setting, in which irregular vertices cannot be avoided. The critical question in this setting concerns the smoothness properties around irregular vertices. The key tool in this analysis is the local subdivision matrix and its structure. The fact that the analysis of these schemes can be reduced to the analysis of a local matrix is due to the local support of the basis functions. In other words, the behavior of the surface in a neighborhood of a node depends only on those basis functions whose support overlaps a neighborhood of the node.

For Loop's scheme, the relevant neighborhood around a vertex is a 2-ring, i.e., all vertices which can be reached by traversing no more than two edges. The subdivision matrix expresses the linear relationship between the nodal positions in a 2-ring around a given vertex at level k and the nodal positions around the same vertex in the 2-ring at level k+1. This 2-ring analysis is required to establish smoothness. Details of this approach, including necessary and sufficient conditions, can be found in the literature. Once the analytic properties have been established, quantities at a point, such as position or tangents, can be computed using an even smaller subdivision matrix which relates 1-rings at level k to those at level k+1. In the following we will discuss only this simpler setting since it is the one which is needed for actual computations.

Let $X^k$ be the vector of nodal positions of a vertex with valence N and its 1-ring neighbors at level k, $X^k = (x_0^k, x_1^k, \ldots, x_N^k)$. Note that in the surface case we treat this vector as an N+1 vector of three-dimensional vectors, while in the functional setting it would be an N+1 vector of scalars. We can now express the linear relationship between the nodal positions at level k and k+1 with an (N+1)×(N+1) matrix S:

$$X^{k+1} = SX^k \tag{56}$$

The entries of the matrix S are given by the subdivision rules (Eqs. 52 and 51). The study of the limit surface then amounts to examining $$X^\infty = \lim_{k \to \infty} S^k X^0 \tag{57}$$

From this it immediately follows that the limit surface cannot exist if S has an eigenvalue of modulus larger than 1. Furthermore, it can be shown that it must have a single eigenvalue 1 and all other eigenvalues must have modulus strictly smaller than 1. This property also implies that subdivision schemes are affinely invariant, i.e., an affine transformation applied to the nodal positions of the control mesh results in a limit surface having undergone the same affine transformation, which is a desirable property in practical applications. The associated right eigenvector is easily seen to be the vector of all 1's.

In the following we summarize the main results as needed for our finite-element setting. Assume that the subdivision matrix has a complete set of eigenvectors (this property holds for all schemes of practical interest, although it is not necessary for the analysis). Since the subdivision matrix S is not self-adjoint, let $R_I$ and $L_J$ be the right and left eigenvectors of S respectively, $$L_J \cdot R_I = \delta_{IJ} \tag{58}$$

and let $\lambda_1$ be the associated eigenvalues in non-increasing magnitude order, with $\lambda_0=1$. Using the eigenvalue decomposition, the nodal vector $X^0$ can be written as $$X^0 = \sum_{I=0}^{N} a_I^0 R_I \tag{59}$$

with $a^0{}_I = L_I \cdot X^0$. Choosing this basis, Eq. 57 takes the simple form:

$$X^\infty = \lim_{k \to \infty} S^k \sum_{I=0}^{N} a_I^0 R_I = \lim_{k \to \infty} \sum_{I=0}^{N} \lambda_I^k a_I^0 R_I \tag{60}$$

From this representation and the facts that $\lambda_0=1$ and $|\lambda_1|<1$ for $I=1,\ldots,N$, it follows immediately that the center nodal position as well as all nodal positions in the 1-ring converge to $$X^\infty = a_0^0 R_0 \tag{61}$$

Since $R_0$ has the form $R_0=(1, 1, \ldots, 1)$ all the nodal positions in the 1-ring neighborhood actually converge to a single position:

$$a_0^0 = L_0 \cdot X^0 \tag{62}$$

For the original Loop subdivision scheme, $L_0$ is given as:

$$L_0 = (1 - Nl, l, \ldots, l) \text{ with } l = \frac{1}{3/(8w) + N}. \tag{63}$$

In practical terms this means that we can evaluate the limit position of the surface given at any finite subdivision level by simply applying the position mask 70 shown in FIG. 7a. We can continue this analysis and compute tangent vectors in a similar way. Assume that the control nodal positions have been translated by $a_0$ so that the limit position for our selected vertex is the origin. The leading term of Eq. 60 is now controlled by the subdominant eigenvalues. Here we have $\lambda_1 = \lambda_2 > \lambda_3$, which results in:

$$\lim_{k \to \infty} \frac{X^k}{\lambda_1^k} = a_1^0 R_1 + a_2^0 R_2 \tag{64}$$

indicating that the nodal positions in the 1-ring all converge to a common plane spanned by the vectors $a^0{}_1$ and $a^0{}_2$. While these vectors are not necessarily orthogonal, they do span a plane for almost all initial configurations. An explicit formula for two tangent vectors to the limit surface is:

$$t_1 = L_1 \cdot X^0 \quad t_2 = L_2 \cdot X^0 \tag{65}$$

whence the shell director follows as:

$$a_3 = \frac{t_1 \times t_2}{|t_1 \times t_2|} \tag{66}$$

In certain settings we may have $\lambda_1 \geq \lambda_2 > \lambda_3$. The above equations for tangent vectors continue to hold, requiring an argument only slightly more involved than the one above. For Loop's scheme, $L_1, L_2$ are given by $$L_1 = (0, c_1, c_2, \ldots, c_N) \quad L_2 = (0, s_1, s_2, \ldots, s_N) \tag{67}$$

with $$c_I = \cos\frac{2\pi(I-1)}{N} \quad s_I = \sin\frac{2\pi(I-1)}{N}.$$

Again we find that a very simple computation allows us to compute the limit surface normal given the subdivision mesh at any level k. FIGS. 7b and 7c show two tangent masks 72, 74 corresponding to Eqs. 65 and 67.

So far we have only discussed the evaluation of position and tangents of the limit surface at parametric locations corresponding to control vertices. For numerical evaluation of the Kirchhoff-Love energy functional we need to evaluate these quantities—and curvature quantities—at quadrature points. This is particularly simple in the case of Loop's scheme (and similarly so for Catmull-Clark's scheme) since Loop's scheme actually generalizes quartic box splines (Catmull-Clark's scheme generalizes bi-cubic splines). If the valencies of the vertices of a given triangle are all equal to 6, the resulting piece of limit surface is exactly described by a single quartic box-spline patch, for which very efficient evaluation schemes exist at arbitrary parameter locations. We call such a patch regular. FIG. 8 is a graphical example of a regular box-spline patch with 12 control points. Regular patches are controlled by 12 basis, or shape, functions (see Appendix A.0.1), since only their support overlaps the given patch. If a triangle is irregular, i.e., one of its vertices has valence other than 6 the resulting patch is not a quartic box spline. Arbitrary parameter locations may nevertheless be treated simply by the method described in the next section.

Function Evaluation for Arbitrary Parameter Values

In this section we discuss the evaluation of function values and derivatives for Loop subdivision surfaces at arbitrary parameter locations. These function evaluations arise during the computation of element stiffness and force arrays by numerical quadrature, Eq. 46. Despite early attempts, the proper parameterization of subdivision surfaces has been until recently an unsolved problem in the vicinity of irregular vertices. Stam (J. Stam, "Fast evaluation of catmull-clark subdivision surfaces at arbitrary parameter values," in *Computer Graphics (SIGGRAPH '98 Proceedings)*, 1998; J. Stam, "Fast evaluation of loop triangular subdivision surfaces at arbitrary parameter values," in *Computer Graphics (SIGGRAPH '98 Proceedings, CD-ROM supplement)*, 1998) presented an elegant solution to this problem based on the eigendecomposition of the subdivision matrix.

A conventional local parameterization of the limit surface may be obtained as follows. For each triangle in the control mesh we choose $(\theta^1, \theta^2)$ as two of its barycentric coordinates within their natural range $$T = \{(\theta^1, \theta^2), s, t, \theta^\alpha \in [0, 1]\} \tag{68}$$

The triangle T in the $(\theta^1, \theta^2)$-plane may be regarded as a master or standard element domain. It should be emphasized that this parameterization is defined locally for each element in the mesh. The entire discussion of parameterization and function evaluation may therefore be couched in local terms.

Consequently we proceed to consider a generic element in the mesh and introduce a local numbering of the nodes lying in its immediate 1-neighborhood. For regular patches such as depicted in FIG. 8, Loop's scheme leads to classical quartic box splines. Therefore, the local parameterization of the limit surface may be expressed in terms of box-spline shape functions, with the result:

$$x(\theta^1, \theta^2) = \sum_{I=1}^{12} N^I(\theta^1, \theta^2) x_I \qquad (69)$$

where now the label I refers to the local numbering of the nodes. The precise form of the shape functions $N^I(\theta^1, \theta^2)$ is given in Appendix A.0.1. The surface within the shaded triangle in FIG. 8 is controlled by the 12 local control vertices. In contrast to Hermitian interpolation, the surface is solely controlled by the position of these control vertices, and first- or second-order derivatives at the nodes are not utilized. The image of the standard domain T under the embedding (Eq. 69) constitutes the geometric domain of the element under consideration within the limit surface. The embedding may thus be regarded as a conventional isoparametric mapping from the standard domain T onto $\Omega$, with $(\theta^1, \theta^2)$ playing the role of natural coordinates.

The parameterization in Equation 69 may also be used for the displacement field. Locally one then has $$u_h(\theta^1, \theta^2) = \sum_{I=1}^{12} N^I(\theta^1, \theta^2) u_I \qquad (70)$$

For function evaluation on irregular patches the mesh has to be subdivided until the parameter value of interest is interior to a regular patch. At that point the regular box-spline parameterization applies once again. It should be noted that the refinement is performed for parameter evaluation only. For simplicity we assume that irregular patches have one irregular vertex only. This restriction can always be met for arbitrary initial meshes through one step of subdivision, which has the effect of separating all irregular vertices.

Figure 9:
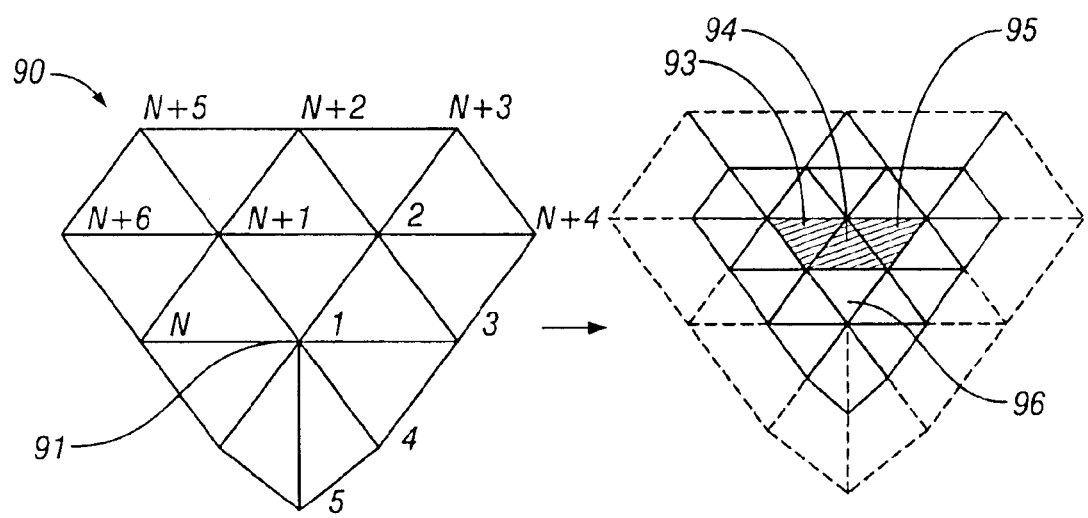
FIG. 9 is a diagram showing the basic idea for function evaluation at arbitrary parameter values.

FIG. 9 illustrates the basic idea for function evaluation at arbitrary parameter values. It shows a patch 90 having a single vertex 91 of valence 7. After one level of subdivision this irregular patch 90 is divided into three regular sub-patches 93–95, and one irregular sub-patch 96. If the desired parameter value lies within the regular sub-patches we may immediately evaluate the surface by using the canonical regular-patch evaluation routine. If our desired parameter location lies within the irregular sub-patch 96, we must repeatedly subdivide until desired parameter location falls within a regular patch. This can be achieved for any parameter value away from the irregular vertex; for the irregular vertex itself we have already described the evaluation procedure above.

The action of the subdivision operator for the entire neighborhood defined by the sub-patches 93–96 can again be described by a matrix:

$$X^1 = A X^0 \qquad (71)$$

Figure 10:
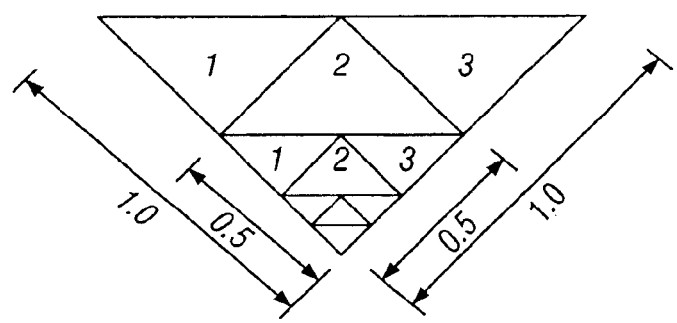
FIG. 10 is a diagram showing the relation between the coordinates $(\theta^1, \theta^2)$ of original triangles and the coordinates $(\theta^1, \theta^2)$ of refined triangles.

The matrix A now has dimension (N+12, N+6) and its entries can be derived from the subdivision rules as presented above. For the proposed shell element with one-point quadrature at the barycenter of the element, a single subdivision step is sufficient, since the sampling point lies in sub-patch 94. We define 12 selection vectors $P_I$, I=1, ... 12 of dimension (N+12) which extract the 12 box-spline control points for sub-patch 94 from the N+12 points of the refined mesh. The entries of $P_I$ are zeros and one depending on the indices of the initial and refined meshes. To evaluate the function values in the three triangles 93–95 with the box-spline shape functions $N^j$, a coordinate transformation must be performed. The relation between the coordinates $(\theta^1, \theta^2)$ of the original triangles and the coordinates $(\tilde\theta^1, \tilde\theta^2)$ of the refined triangles can be established from the refinement pattern shown in FIG. 10. For the center of sub-patch 94 we have the following relation:

$$\tilde\theta^1 = 1 - 2\theta^1 \quad \tilde\theta^2 = 1 - 2\theta^2 \qquad (72)$$

The function values and derivatives for sub-patch 94 can now be evaluated using the interpolation rule:

$$x(\theta^1, \theta^2) = \sum_{I=1}^{12} N^I(\tilde\theta^1, \tilde\theta^2) P_I A X^0 \qquad (73)$$

Differentiation of the above equation yields the partial derivatives of x at the desired location. In these calculations, the jacobian matrix of the simple mapping (Eq. 73) between the coordinates $(\theta^1, \theta^2)$ and $(\tilde\theta^1, \tilde\theta^2)$ has to be included. The result is:

$$x_{1\alpha}(\theta^1, \theta^2) = -2 \sum_{I=1}^{12} N^I_{1\alpha}(\tilde\theta^1, \tilde\theta^2) P_I A X^0 \equiv a_\alpha(\theta^1, \theta^2) \qquad (74)$$

The jacobian of the embedding required in the quadrature rule (Eq. 46) can in turn be computed directly from $a_\alpha$ through Eq. 8. Second-order derivatives such as required for the computation of bending strains follow simply by direct differentiation of the interpolation rule (Eq. 74).

The evaluation procedure just described is a simplified version of the scheme presented by Stam, cited above, for function evaluation at arbitrary parameter values. Since we are only interested in a one-point quadrature rule, a single subdivision step is sufficient. For other rules one may need to subdivided further. Stam describes the general case in which the eigendecomposition of A is exploited to perform the implied subdivision steps through suitable powers of A in the eigenbasis, a simple and efficient procedure.

Boundary Conditions

Figure 11A:
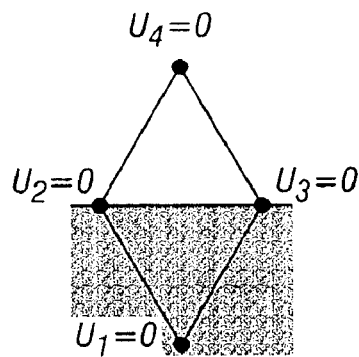
FIGS. 11a, and 11b, and 11c are diagrams showing various boundary conditions for the cases of displacements and rotations fixed (FIG. 11a), displacement and rotations free (FIG. 11b), and displacements fixed and rotations free (FIG. 11c).
Figure 11B:
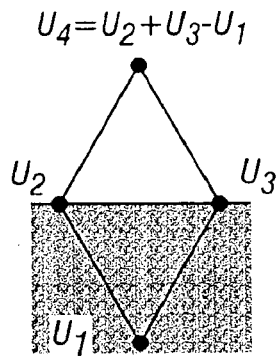
Figure 11C:
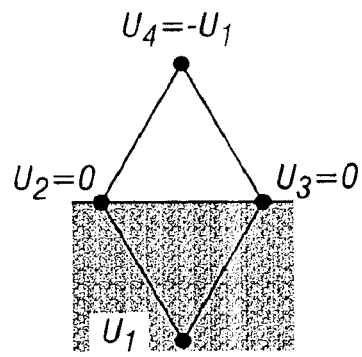

Due to the local support of the subdivision scheme, the boundary displacements are influenced only by the nodal positions in the 1-neighborhood of the boundary, i.e., the first layer of vertices inside the domain as well as a collection of artificial or "ghost" vertices just outside the domain. For example, for built-in boundary conditions the displacements of the nodes inside, outside, and on the boundary must be zero. The deformation of the boundary computed with the limit formula as described above shows that this results in zero displacements and in fixed tangents. Other boundary conditions can be accommodated in a similar way. FIGS. 11a, 11b, and 11c show various boundary conditions for the cases of displacements and rotations fixed (FIG. 11a), displacement and rotations free (FIG. 11b), and displacements fixed and rotations free (FIG. 11c).

The enforcement of prescribed boundary displacements is equally straightforward. General displacement boundary conditions may be formulated with the aid of a local reference frame defined by the surface normal and the tangent to the boundary of the shell.

The prescribed displacement boundary conditions may be regarded as linear constraints on the displacement field and treated accordingly during the solution process. Such linear constraints may be enforced by a variety of known methods.

In all the calculations discussed in the examples presented here, the displacement boundary conditions are enforced by the penalty method, with a penalty stiffness equal to 100 times the maximum diagonal component of the stiffness matrix.

Computer Implementation of Subdivision-Based Shell Elements

Figure 12:
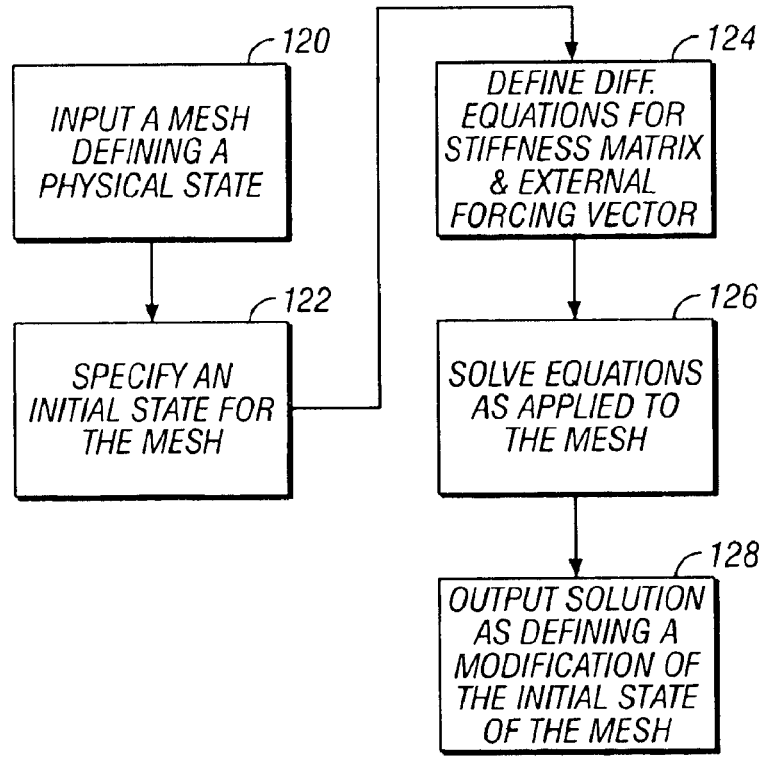
FIG. 12 is a flowchart showing a functional method for performing finite element analysis using subdivision basis functions.

The current implementation of subdivision-based shell elements in accordance with the invention requires a few data structures in addition to those typical of conventional finite element methods. For example, tables of element adjacencies are used for the computation of element arrays. In our particular implementation, we use a Triangle C-structure which stores the following information for each element of the mesh:

typedef struct _T {
/* pointer to the element vertices */
/* pointer to the neighbor triangles */
/* array of pointers to the vertices in the 1-neighborhood */
/* number of nodes in the 1-neighborhood */
/* information about the boundary conditions of the edges */
} Triangle;

The preferred method for performing finite element analysis using subdivision basis functions can be summarized functionally as follows, referring to FIG. 12:

1. Input a mesh comprising a set of data points each having connectivity to neighboring data points, the mesh defining the physical state of an object or system (STEP 120);
2. Specify an initial state for the mesh (STEP 122);
3. Define a set of linear differential equations comprising a stiffness matrix (which represents the material and structural properties of the object or system) and an external forcing vector (which defines load conditions), at least one such equation having a fourth order differential operator (this last requirement ensures that second order derivatives must exist, a requirement for $H^2$ functions) (STEP 124);
4. Solve the set of linear equations as applied to the mesh (STEP 126); and
5. Output the solution to the set of linear equations as defining a modification of the initial state of the mesh based on the stiffness matrix and in response to the external forcing vector (STEP 128).

Figure 13:
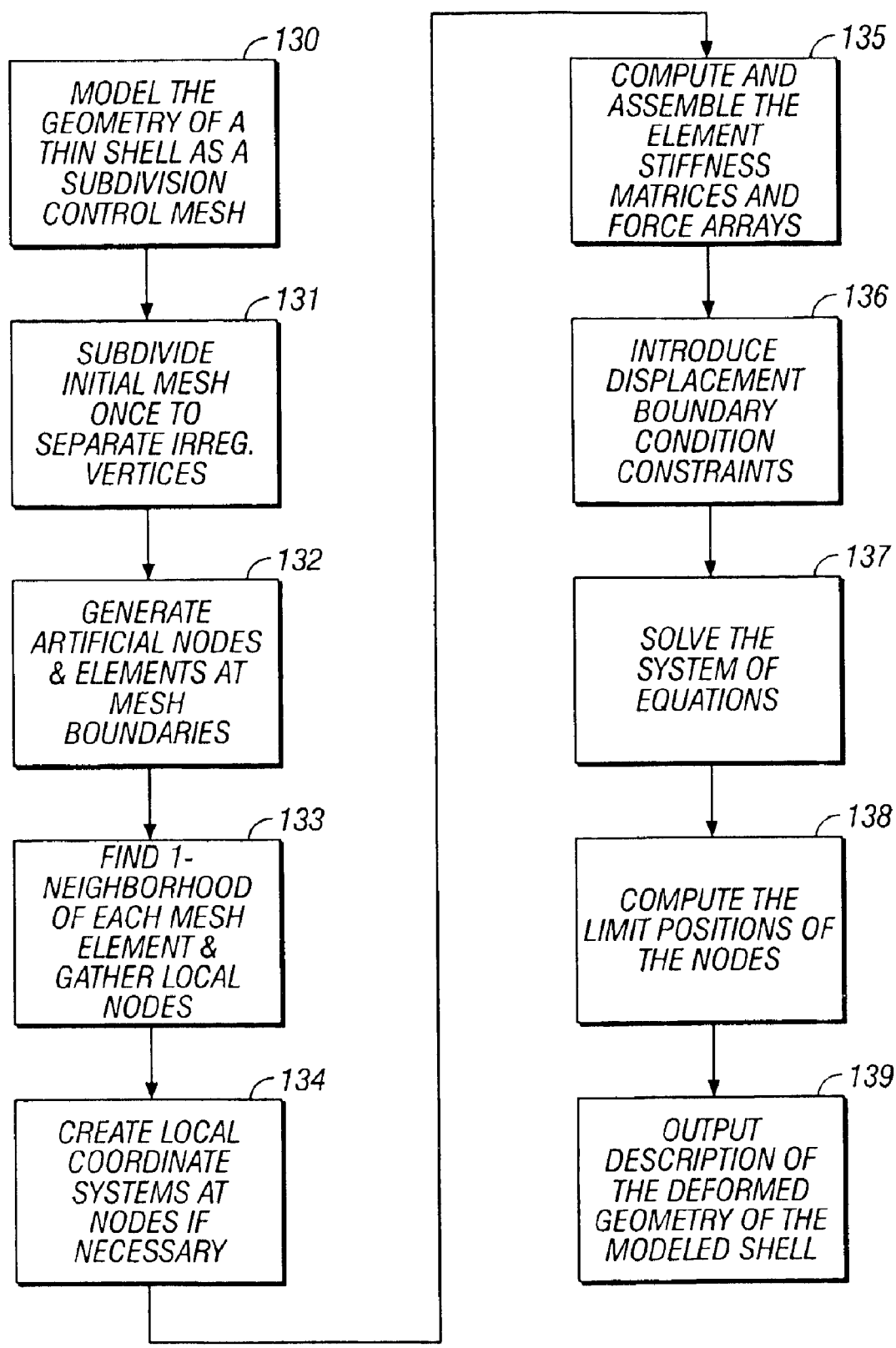
FIG. 13 is a flowchart showing one analytical solution process for performing finite element analysis using subdivision basis functions.

This procedure can be implemented by programming the relevant equations set forth above in light of known techniques for finite element analysis. In more detail, referring to FIG. 13, one analytical solution process consists of the following steps:

1. Model the geometry of a thin shell with a subdivision control mesh (STEP 130);
2. Subdivide the initial subdivision control mesh once in order to separate the irregular vertices (the initial mesh could include triangles with more than one irregular vertex—in order to limit the number of possible mesh patterns during the parameter evaluation, we refine the mesh once so that each triangle has at most one irregular vertex) (STEP 131);
3. Generate artificial nodes and elements at the boundaries of the mesh (STEP 132);
4. Find the 1-neighborhood of each element of the mesh and gather the local nodes in accordance with the local numbering convention. (STEP 133);
5. Create local coordinate systems at the nodes if necessary (for the creation of the local coordinate systems, this embodiment employs the limit formula of Eq. 66 for the shell normal)(STEP 134);
6. Compute and assemble the element stiffness matrices and force arrays (STEP 135);
7. Introduce displacement boundary condition constraints (STEP 136);
8. Solve the system of equations (STEP 137);
9. Compute the limit positions of the nodes (Eq. 61)(STEP 138); and
10. Output a graphic or textual description of the deformed geometry of the modeled shell based on the computed limit positions of the nodes (see examples below for graphical output of deformed shell geometries)(STEP 139).

The elements under consideration here have three nodes and three displacement degrees of freedom per node. In a preferably embodiment, we use one-point quadrature with the sole quadrature point in the rule located at the barycenter of the element, i.e., at $\theta_G^1=\frac{1}{3}$ and $\theta_G^2=\frac{1}{3}$. The corresponding weight is $w=\frac{1}{2}$, which, evidently, is the area of the standard triangle T.

In sum, the preceding developments lead to the definition of a class of fully conforming "$C^1$" triangular elements containing three nodes and one quadrature point. This combination of attributes, namely, the low order of interpolation and quadrature required, render the element particularly attractive from the standpoint of computational efficiency. As mentioned earlier, subdivision surfaces may also be used to define four-node square shell elements. The finite element analysis preferably uses subdivision basis functions as shape functions, but may in general use any suitably smooth shape function.

The invention may be implemented in hardware or software, or a combination of both (e.g., programmable logic arrays). Unless otherwise specified, the algorithms included as part of the invention are not inherently related to any particular computer or other apparatus. In particular, various general purpose machines may be used with programs written in accordance with the teachings herein, or it may be more convenient to construct more specialized apparatus to perform the required method steps. However, preferably, the invention is implemented in one or more computer programs executing on programmable systems each comprising at least one processor, at least one data storage system (including volatile and non-volatile memory and/or storage elements), at least one input device, and at least one output device. The program code is executed on the processors to perform the functions described herein.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on a storage media or device (e.g., solid state, magnetic, or optical media) readable by a general or special purpose programmable computer, for configuring and operating the computer when the storage media or device is read by the computer to perform the procedures described herein. The inventive system may also be considered to be implemented as a computer-readable storage medium, configured with a computer program, where the storage medium so configured causes a computer to operate in a specific and predefined manner to perform the functions described herein.

Examples

We proceed to establish the convergence characteristics of the inventive method by running the obstacle course of test cases proposed by Belytschko et al. (T. Belytschko, H. Stolarski, W. K. Liu, N. Carpenter, and J. S. J. Ong, "Stress projection for membrane and shear locking in shell finite-elements," *Comput. Methods Appl. Mech. Engrg.*, 51:221–258, 1985). The shells in these tests cases take simple spherical or cylindrical shapes which can be readily described analytically. A preliminary step in the calculations is to approximate the exact surface of the shell by a subdivision surface in accordance with the invention. Several methods of approximation are possible, including (1) least-squares approximation of the exact surface by the limit surface, and (2) placement of the control-mesh nodes on the exact surface.

However, theoretical consideration and our own numerical tests show that the error incurred in the approximation of the shell geometry is of higher order than the finite-element error, and consequently both methods of approximation result in the same convergence rates asymptotically. It should also be noted that the question of geometrical approximation is rendered moot within an integrated computer-aided geometrical design (CAGD)—finite-element analysis framework. In this environment, the subdivision surface generated by the CAGD module becomes the true shell surface to be analyzed by the finite-element analysis module.

We note for further reference that a strictly $C^1$ finite-element method for Kirchhoff-Love shell theory containing the complete set of third-order polynomials within its interpolation satisfies the error bound:

$$\|u_h - u\|_{2,\Omega} \le \frac{C}{N} |u|_{3,\Omega} \tag{75}$$

where u is the exact solution, $u_h$ is the finite-element solution, C is a constant, N is the number of nodes in the mesh, $\| \|_{2,\Omega}$ is the standard norm over $H^2(\Omega; R^3)$, or "energy norm," and $| |_{3,\Omega}$ is the standard semi-norm over $H^3(\Omega; R^3)$.

The central question to be ascertained now is whether the method developed in the foregoing exhibits the optimal convergence rate implied by the bound (Eq. 75). All the calculations described subsequently are carried out with one-point quadrature. The successive mesh refinements considered in convergence studies are obtained by regular refinement.

We additionally compare the performance of the proposed approach with that of two other shell elements:

ASM: The assumed-strain four-node shell element of Simo et al. (J. C. Simo, D. D. Fox, and M. S. Rifai, "On a stress resultant geometrically exact shell model. part ii: The linear theory; computational aspects," *Comput. Methods Appl. Mech. Engrg.*, 73:53–92, 1989).

DKT-CST: A flat 3-node element with no membrane/bending coupling. In this element the discrete Kirchhoff triangle (DKT) formulation of Batoz (J. L. Batoz, "An explicit formulation for an efficient triangular plate-bending element", *Internat. J. Numer. Methods Engrg.*, 18:1077–1089, 1982) is utilized for the bending response, and standard constant strain interpolation is used for the membrane response. The resulting element has six degrees of freedom per node.

Rectangular Plate

As a first example, we consider the simple case of a square plate under uniform loading p=1. FIG. 14 shows an example of such a rectangular plate 140, where the length of the plate 140 is L=100 and the thickness is h=1. These dimensions place the plate well within the scope of Kirchhoff's theory. The Young's modulus is $E=10^7$ and the Poisson's ratio is v=0. In order to test the treatment of displacement boundary conditions described above, we analyze both a simply-supported and a clamped plate. The entire plate is discretized into finite elements with no account taken of the symmetry of the plate. A typical mesh 142 used in the calculations is shown in FIG. 14. The artificial or ghost nodes used to enforce the boundary conditions are not shown in the figure.

Figure 16A:
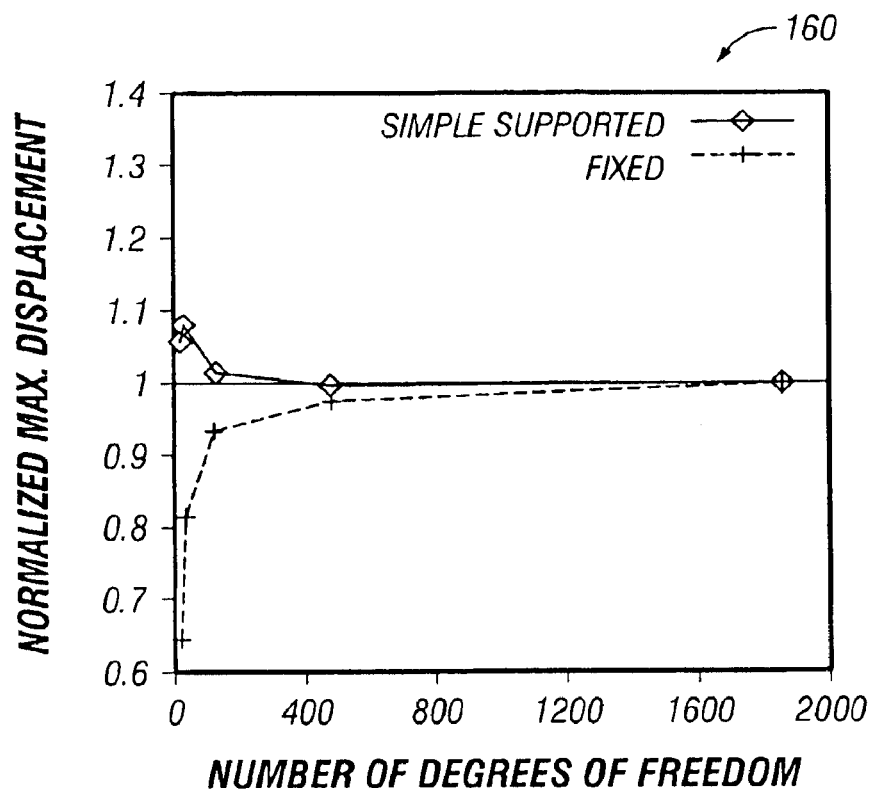
FIGS. 16a and 16b are graphs respectively showing the convergence of the computed maximum-displacement and energy-norm errors as a function of the number of degrees of freedom for the plate of FIG. 15b.
Figure 16B:
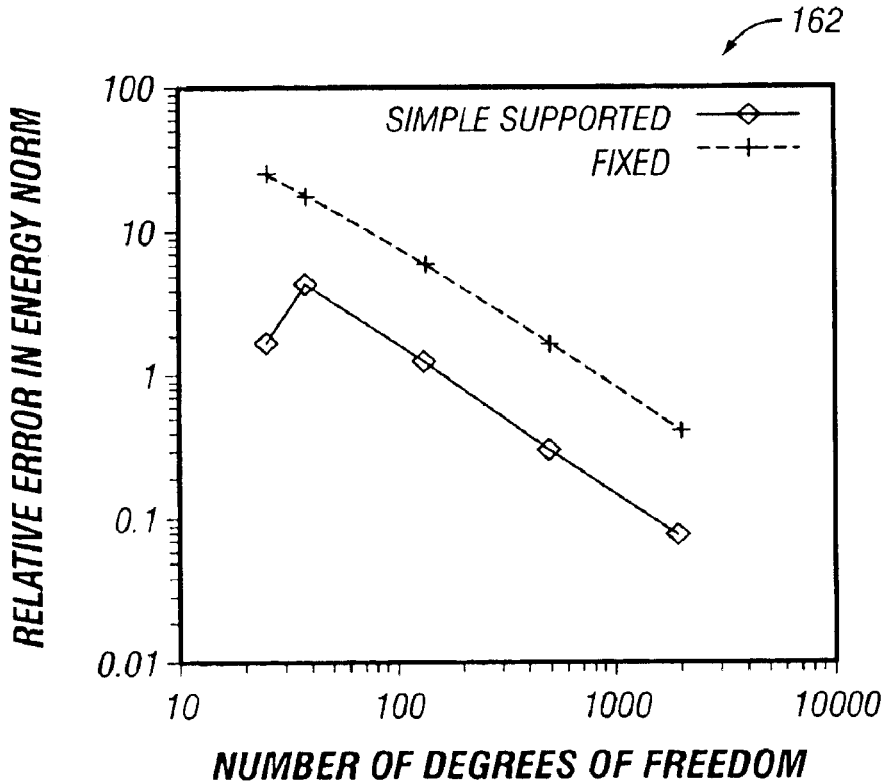

FIGS. 15a and 15b respectively show the computed limit surfaces of the simply-supported plate 150 and the clamped plate 152 following deformation (deflections are scaled differently in both cases). The high degree of smoothness of these deflected shapes is noteworthy. An appealing feature of the problem under consideration is that it is amenable to an exact analytical solution. For instance, the maximum displacement at the center of the plate is found to be: $u_{max} \approx 0.487$ for the simply-supported plate 150, and $u_{max} \approx 0.151$ for the clamped plate 152. It therefore follows that the solution error can be computed exactly for this problem. FIGS. 16a and 16b respectively show graphs of the convergence of the computed maximum-displacement 160 and energy-norm 162 errors as a function of the number of degrees of freedom. In all cases, the optimal convergence rate $O(N^1)$ is attained in the energy norm, which attests to the good convergence properties of the method. These results, and those presented subsequently, also demonstrate the sufficiency of the one-point quadrature rule.

Scordelis-Lo Roof

Figure 17:
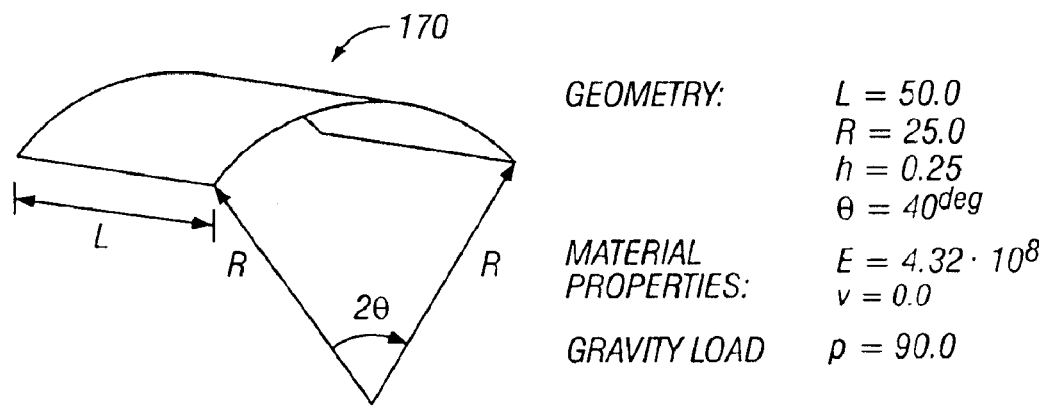
FIG. 17 is a diagram showing an example of a Scordelis-Lo Roof cylindrical shell.

The Scordelis-Lo Roof is a membrane-stress dominated problem and, as such, it provides a useful test of the ability of the finite-element element method to represent complex states of membrane strain. The problem concerns an open cylindrical shell loaded by gravity forces. FIG. 17 shows an example of a Scordelis-Lo Roof cylindrical shell 170. In our calculations, the length of the cylinder is L=50; its radius is R=25; the angle subtended by the roof is $\phi=80°$; the thickness is h=0.25; the Young's modulus is $E=4.32 \, 10^8$; and the Poisson's ratio is v=0.

Figure 18A:
FIGS. 18a and 18b are diagrams respectively showing the undeformed control mesh and the deformed limit surface for the shell of FIG. 17.
Figure 18B:
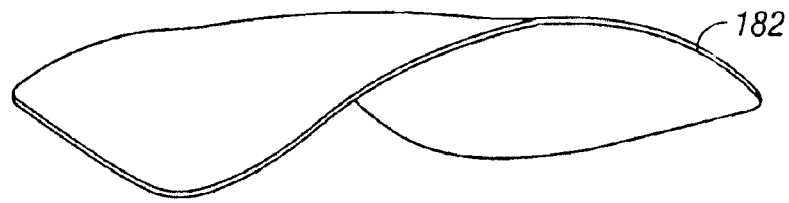
Figure 19:
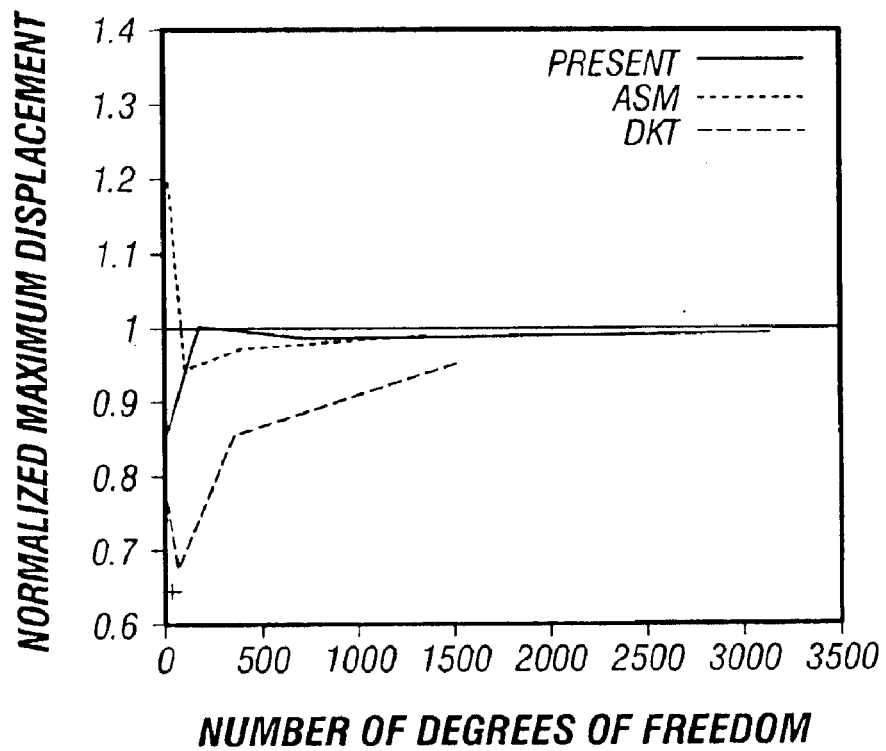
FIG. 19 shows a convergence plot for the maximum displacement of the deformed limit surface of FIG. 18b.

FIGS. 18a and 18b respectively show the undeformed control mesh 180 and the deformed limit surface 182. FIG. 19 shows a convergence plot for the maximum displacement of the deformed limit surface 182. The displacements are normalized by the value 0.3024 as given by Belytschko, cited above. The excellent convergence characteristics of the method are evident from the figure. In particular, the subdivision element outperforms both the assumed-strain and the DKT elements.

Pinched Cylinder

Figure 20A:
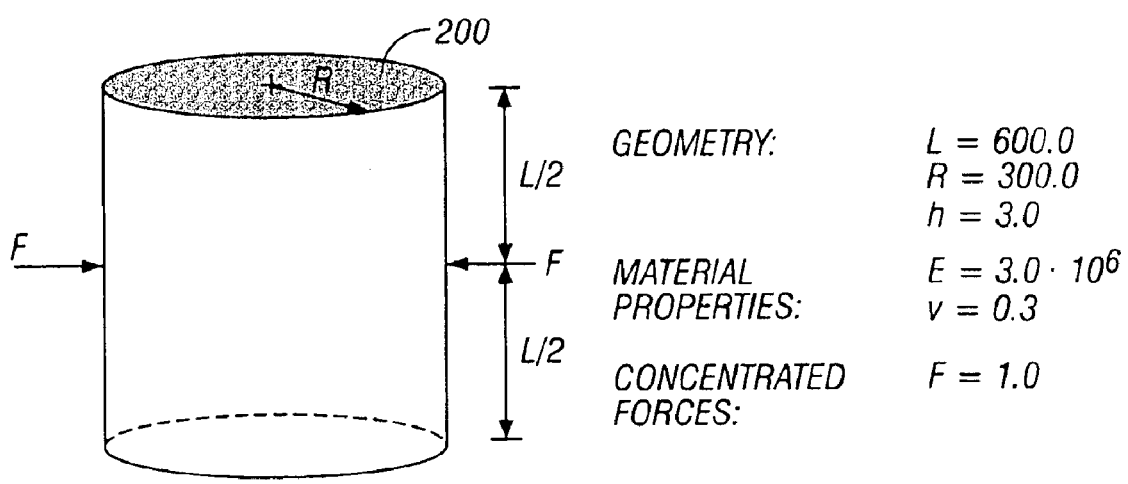
FIG. 20a is a diagram showing an example of a cylindrical shell.

The pinched-cylinder problem tests the inventive method's ability to deal with inextensional bending modes and complex membrane states. The problem concerns a cylindrical shell pinched under the action of two diametrically opposite unit loads located within the middle section of the shell. We consider two cases: free-end boundary conditions; and ends constrained by two rigid diaphragms. FIG. 20a shows an example of a cylindrical shell 200. The length of the cylinder 200 is L=600; the radius is R=300; the thickness is h=3; the Young's modulus is $E=3\times10^6$; and the Poisson's ratio is v=0.3.

A control-mesh node is placed at the point of application of the loads. It is interesting to note, however, that, owing to the nonlocal character of the shape functions, the point load is spread over several nodes. This is in contrast to other methods, e.g., those based on Hermitian interpolation. It should be carefully noted that the shape functions developed here possess the requisite partition-of-unity property and, in consequence, the resultant of all nodal forces exactly matches the applied load.

Figure 20B:
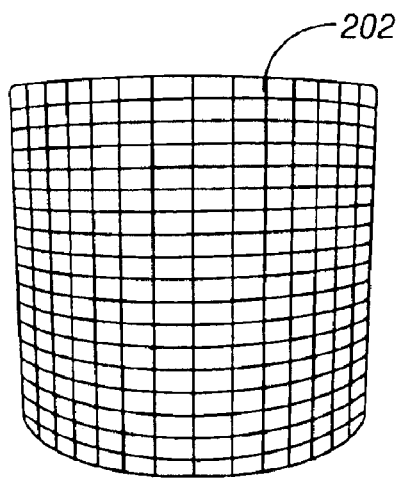
Figure 20C:
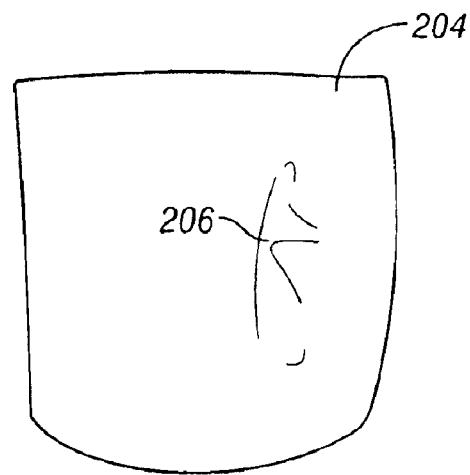
FIG. 20c is a diagram showing the computed deformed limit surface for the cylinder of FIG. 20a, with two point loads.
Figure 21A:
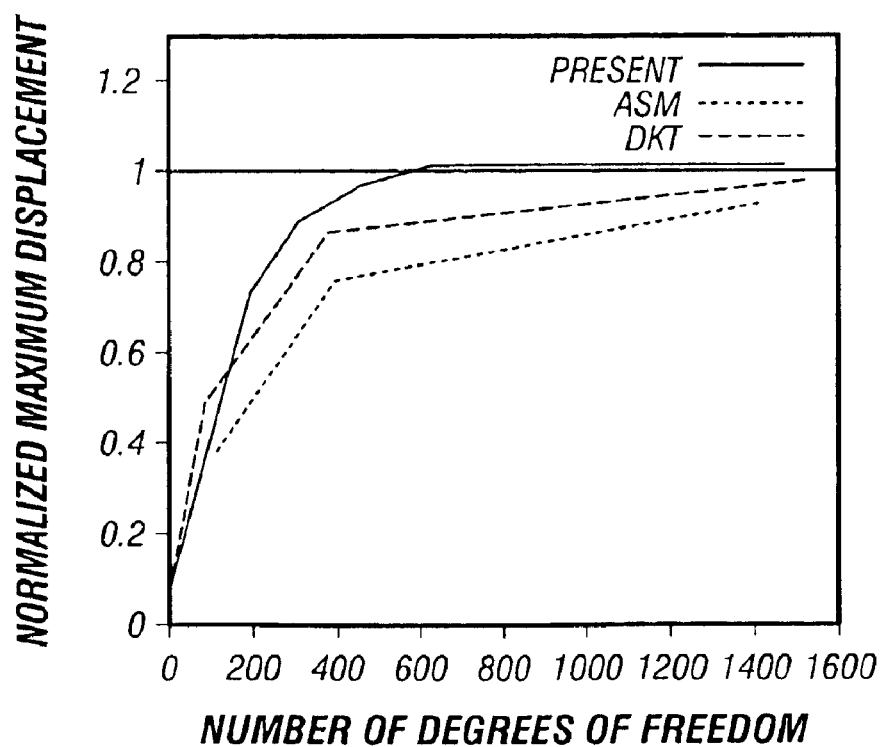

FIG. 20b shows a typical control mesh 202 for the cylinder of FIG. 20a. FIG. 20c shows the computed deformed limit surface 204, with the load point 206 on one side. Here again, the high degree of smoothness of the deformed surface, which attests to the conforming nature of the method, is noteworthy. FIGS. 21a and 21b respectively show displacement-convergence results for the rigid diaphragm case and the free-end case. In the rigid diaphragm case, we monitor the displacements under the loads, which are normalized by the analytical solution of $1.82488 \times 10^{-5}$. The excellent convergence properties of the method are evident from the figure. As may be seen, the subdivision element converges faster than both the assumed-strain and the DKT elements. The analytical solution for the free-end case has been given by Timoshenko (S. Timoshenko, *Theory of Plates and Shells*, McGraw-Hill Book Company Inc., New York-London, 1940). Timoshenko's solution gives a value of $4.520 \times 10^{-4}$ for the displacements under the loads, and a value of $4.156 \times 10^{-4}$ for the change in diameter at the free ends. The convergence of this latter quantity is shown FIG. 21b. Here again, the robust convergence characteristics of the numerical solution is noteworthy.

Hemispherical Shell

The case of a spherical shell provides an example of a surface which cannot be triangulated without the inclusion of irregular nodes, or nodes of valence different from 6. Under these conditions, a naive implementation of a box-spline-based finite-element method necessarily breaks down, which illustrates the need for the more general treatment developed here. We consider a shell of hemispherical shape deforming under the action of four point loads acting on its edge. FIG. 22a shows an example of a hemispherical shell 220. The radius of the hemisphere is R=10; the thickness is h=0.04; the Young's modulus is E=6.825 $10^7$; and the Poisson's ratio is v=0.3. The edge of the shell is free. The applied loads have a magnitude F=2 and define two pairs of diametrically opposite loads alternating in sign at 90°.

Figure 23:
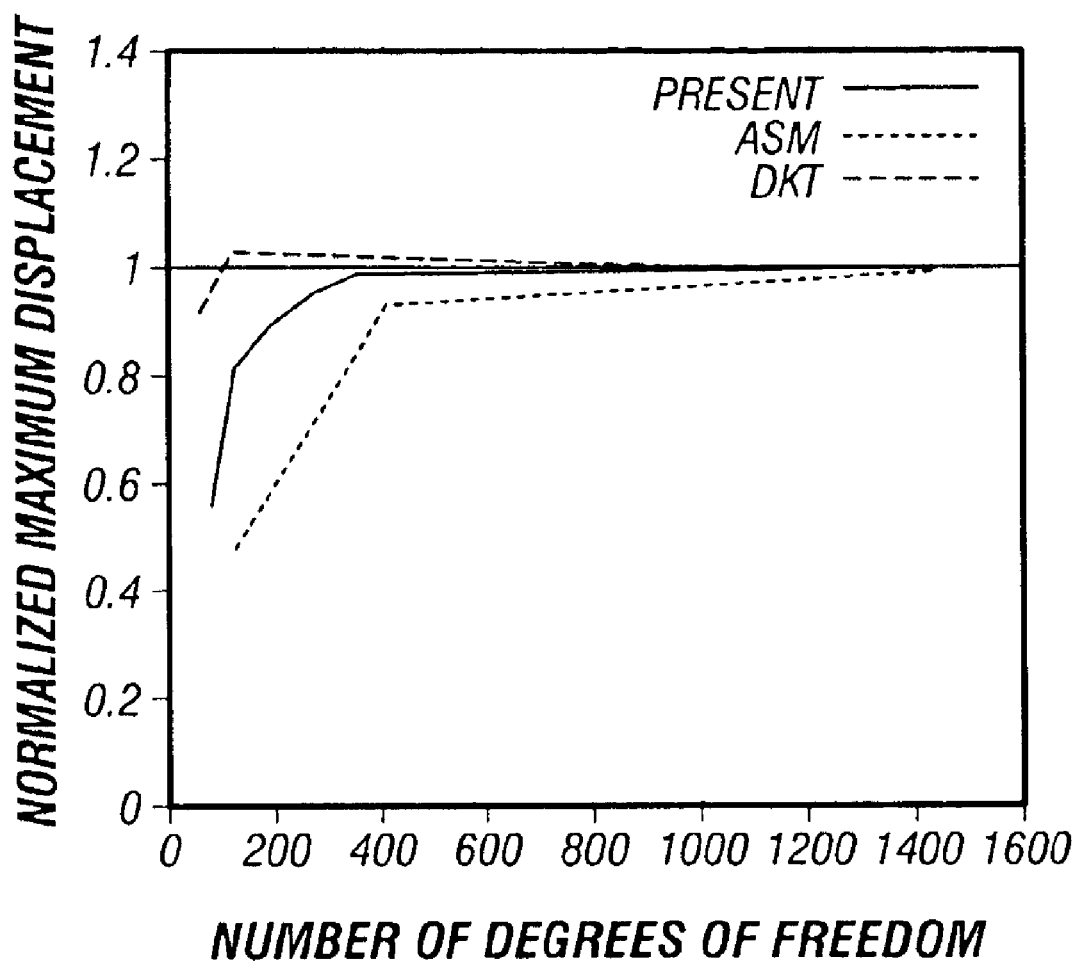
FIG. 23 shows the convergence of the radial normalized displacement under the applied loads for the hemispherical shell of FIG. 22a, FIG. 22b, and FIG. 22c.

FIGS. 22b and 22c respectively show a typical control mesh 222 and the corresponding deformed limit surface 224. The presence of irregular nodes in the control mesh 222 should be carefully noted. FIG. 23 shows the convergence of the radial normalized displacement under the applied loads. The displacements are normalized by the exact solution 0.0924 as given by Belytschko, cited above. The hemispherical shell is a standard test for assessing an element's ability to represent inextensional deformation. Critical to the performance of the element is its ability to bend without developing parasitic membrane strains. Accordingly, the flat DKT element with uncoupled membrane and bending stiffness performs particularly well in the pinched-hemisphere shell problem. However, a careful examination of FIG. 23 reveals that the subdivision element attains convergence faster than even the DKT element. The excellent convergence characteristics of the method are again evident from the figure.

CONCLUSIONS

We have presented a new paradigm for thin-shell finite-element analysis based on the use of subdivision surfaces for (1) describing the geometry of the shell in its undeformed configuration, and (2) generating smooth interpolated displacement fields possessing bounded energy within the strict framework of the Kirchhoff-Love theory of thin shells. Several salient attributes of the inventive interpolation scheme bear emphasis:

The undeformed and deformed surfaces of the shell, or equivalently the displacement field thereof, follow by the recursive application of local subdivision rules to nodal data defined on a control triangulation of the surface. The particular subdivision strategy adopted here is Loop's scheme. Whether directly at regular nodes of valency 6, or following an appropriate number of subdivision steps in the case of irregular nodes, the limit surface can be described locally by quartic box splines. Subdivision rules may also be defined for square meshes. The subdivision rules may also be generalized to account for creases and displacement boundary conditions.

The limit surfaces obtained by subdivision, and the displacement fields they support, are $C^2$ except at isolated extraordinary points. The displacement field is guaranteed to be $H^2$, i.e., to be square-summable and to have first and second square-summable derivatives. In consequence, the interpolated displacement fields have a finite Kirchhoff-Love energy. In the parlance of the finite-element method, the proposed interpolation scheme is strictly $C^1$ and therefore meets the convergence requirements of the displacement finite-element method.

The triangles in the control mesh induce subregions on the limit surface which may be regarded as bona fide finite elements. In particular, the energy—and all other extensive properties—of the shell may be computed as a sum of integrals extended to the domains of the elements. These element integrals may conveniently be evaluated by numerical quadrature without compromising the order of convergence of the method. A one-point quadrature rule is sufficient for the computation of element integrals resulting from Loop's subdivision scheme.

The displacement field of the shell is interpolated from nodal displacements only. In particular, no nodal rotations are used in the interpolation. However, the interpolation scheme developed here differs from conventional $C^0$ finite-element interpolation in a crucial respect: the displacement field over an element depends on the displacements at the three nodes of the element and on the displacements of the 1-ring of nodes connected to the element. In this sense, the interpolation rule is nonlocal. However, the use of subdivision surfaces ensures that all the local displacement fields defined over overlapping patches combine conformingly to define one single limit surface.

In sum, subdivision surfaces enable the finite-element analysis of thin shells within the strict confines of Kirchhoff-Love theory while meeting all the convergence requirements of the displacement finite-element method. In particular the ability to couch the analysis within the framework of Kirchhoff-Love theory entirely sidesteps the difficulties associated with the use of $C^0$ methods in the limit of very thin shells. In a particularly pleasing way, subdivision surfaces enable the return to the most basic-and fundamental-of finite element approaches, namely, constrained energy minimization over a suitable subspace of interpolated displacement fields, or Rayleigh-Ritz approximation. Finite-element methods formulated in accordance with this prescription satisfy the orthogonality property, i.e., the error function is orthogonal to the space of finite-element interpolants; and possess the best-approximation property, i.e., the energy norm of the error is minimized by the finite-element solution. These properties render the basic finite-element method exceedingly robust and account for much of its success. Our numerical experiments show that the approach proposed here does indeed lead to the optimal convergence rate predicted by finite-element theory.

Another key advantage afforded by the approach developed here is that subdivision surfaces provide a common representation paradigm for both solid modeling and shell analysis, with the attendant unification of traditionally heterogeneous software tools. By virtue of this unification, surface geometries generated by a computer-aided geometry design (CAGD) module can be directly utilized by the shell-analysis module without the need for any intervening geometrical manipulation. As a consequence, high-level algorithms developed in the field of computer aided geometric design can be integrated simply into the shell analysis software.

A number of possible extensions of the theory and applications of the theory are worth mentioning. Firstly, recursive subdivision provides an effective basis for mesh adaptation. By retaining the hierarchy of finite-element representations generated by subdivision, the application of multiresolution methods and related techniques, such as wavelets, becomes straightforward. Indeed, the application of wavelet methods to the description of complex and intricate geometries has already been extensively pursued within the field of computer graphics. Finally, the extension of the proposed approach to the nonlinear range appears straightforward. In this particular context, the sole use of nodal displacements in the interpolation is expected to simplify the solution procedure by eliminating the need for introducing complex schemes for the nonsingular parameterization of the shell director.

A number of embodiments of the present invention have been described. Nevertheless, it will be understood that various modifications may be made without departing from the spirit and scope of the invention. For example, while the discussion above has focused applied forces as the loading condition, the loading conditions may include thermal loading. Accordingly, other embodiments are within the scope of the following claims.

Appendix

A.0.1 Regular Patches

For regular patches the shape functions are given by the 12 box-spline basis functions. The local numbering of the nodes adopted here is as in FIG. 8.

$$N_1 = \frac{1}{12}(u^4 + 2u^3v) \tag{76}$$

$$N_2 = \frac{1}{12}(u^4 + 2u^3w)$$

$$N_3 = \frac{1}{12}(u^4 + 2u^3w + 6u^3v + 6u^2vw + 12u^2v^2 + 6uv^2w + 6uv^3 + 2v^3w + v^4)$$

$$N_4 = \frac{1}{12}(6u^4 + 24u^3w + 12u^2w^2 + 8uw^3 + w^4 + 24u^3v + 60u^2vw + 36uvw^2 + 6vw^3 + 24u^2v^2 + 36uv^2w + 12v^2w^2 + 8uv^3 + 6v^3w + v^4)$$

$$N_5 = \frac{1}{12}(u^4 + 6u^3w + 12u^2w^2 + 6uw^3 + w^4 + 2u^3v + 6u^2vw + 6uvw^2 + 2vw^3)$$

$$N_6 = \frac{1}{12}(2uv^3 + v^4)$$

$$N_7 = \frac{1}{12}(u^4 + 6u^3w + 12u^2w^2 + 6uw^3 + w^4 + 8u^3v + 8u^3v + 36u^2vw + 36uvw^2 + 8vw^3 + 24u^2v^2 + 60uv^2w + 24v^2w^2 + 24uv^3 + 24v^3w + 6v^4)$$

-continued $$N_8 = \frac{1}{12}(u^4 + 8u^3w + 24u^2w^2 + 24uw^3 + 6w^4 + 6u^3v + 36u^2vw + 60uvw^2 + 24vw^3 + 12u^2v^2 + 36uv^2w + 24v^2w^2 + 6uv^3 + 8v^3w + v^4)$$

$$N_9 = \frac{1}{12}(2uw^3 + w^4)$$

$$N_{10} = \frac{1}{12}(2v^3w + v^4)$$

$$N_{11} = \frac{1}{12}(2uw^3 + w^4 + 6uvw^2 + 6vw^3 + 6uv^2w + 12v^2w^2 + 2uv^3 + 6v^3w + v^4)$$

$$N_{12} = \frac{1}{12}(w^4 + 2vw^3)$$

where the barycentric coordinates (u, v, w) are subject to the constraint:

$$u+v+w=1 \tag{77}$$

The local curvilinear coordinates $(\theta^1, \theta^2)$ for the element may be identified with the barycentric coordinates (v, w).

A.0.2 Irregular Patches

As discussed above, a closed-form representation for the shape functions is not available at irregular vertices. The shell surface within each element is, however, completely described by the nodal positions of the element and its 1-ring. For the one-point quadrature rule used in calculations, the regular patch configuration is recovered after the application of one single subdivision step. In the following we give a more general version of the function evaluation scheme for arbitrary parameter values. The number of subdivision steps required and the attendant coordinate transformations can be computed by the following algorithm due to Stam (J. Stam, "Fast evaluation of loop triangular subdivision surfaces at arbitrary parameter values," in *Computer Graphics* (*SIGGRAPH '98 Proceedings, CD-ROM supplement*), 1998):

```
/* determine the necessary number of subdivisions */
u=v+w;
k=-log10(u)/log10(2.0);
k=ceil(k);
pow2=pow(2.0, (double) (k-1));

/* determine in which domain (v, w) lies */
v*=pow2; w*=pow2;

if (v>0.5) {
    v=2.0*v-1.0; w=2.0*w;
    whpa=1;
} else if (w>0.5) {
    v=2.0*v; w=2.0*w-1.0;
    whpa=3;
} else {
    v=1.0-2.0*v; w=1.0-2.0*w;
    whpa=2;
}
```

The function value at any parameter value is given by:

$$x(\theta^1, \theta^2) = \sum_{I=1}^{NP} N_I(\tilde{\theta}^1, \tilde{\theta}^2) P_I A^k X^0 \quad (78)$$

which generalizes Eq. 73. Here again, the vectors $P_I$ extract the control nodes of the box-spline patch. The variable whpa in the above code gives the number of the subpatch, which contains the coordinates (v, w), and the variable k the power of the matrix A. For Loop's scheme, the subdivision matrix A has the following form:

$$A = \begin{pmatrix} S_{11} & 0 \\ S_{21} & S_{22} \end{pmatrix} \text{ with} \quad (79)$$

$$S_{11} = \frac{1}{8}\begin{pmatrix} 8-8nw & 8w & 8w & 8w & \cdots & 8w \\ 3 & 3 & 1 & 0 & \cdots & 1 \\ 3 & 1 & 3 & 1 & \cdots & 0 \\ \vdots & \vdots & \vdots & \vdots & \ddots & \vdots \\ 3 & 1 & 0 & \cdots & 1 & 3 \end{pmatrix}$$

$$S_{21} = \frac{1}{16}\begin{pmatrix} 2 & 6 & 0 & 0 & \cdots & 0 & 0 & 6 \\ 1 & 10 & 1 & 0 & \cdots & 0 & 0 & 1 \\ 2 & 6 & 6 & 0 & \cdots & 0 & 0 & 0 \\ 1 & 1 & 0 & 0 & \cdots & 0 & 1 & 10 \\ 2 & 0 & 0 & 0 & \cdots & 0 & 6 & 6 \\ 0 & 6 & 0 & 0 & \cdots & 0 & 0 & 2 \\ 0 & 6 & 0 & 0 & \cdots & 0 & 0 & 0 \\ 0 & 6 & 2 & 0 & \cdots & 0 & 0 & 0 \\ 0 & 2 & 0 & 0 & \cdots & 0 & 0 & 6 \\ 0 & 0 & 0 & 0 & \cdots & 0 & 0 & 6 \\ 0 & 0 & 0 & 0 & \cdots & 0 & 2 & 6 \end{pmatrix}$$

$$S_{22} = \frac{1}{16}\begin{pmatrix} 2 & 0 & 0 & 0 & 0 \\ 1 & 1 & 1 & 0 & 0 \\ 0 & 0 & 2 & 0 & 0 \\ 1 & 0 & 0 & 1 & 1 \\ 0 & 0 & 0 & 0 & 2 \\ 6 & 2 & 0 & 0 & 0 \\ 2 & 6 & 2 & 0 & 0 \\ 0 & 2 & 6 & 0 & 0 \\ 6 & 0 & 0 & 2 & 0 \\ 2 & 0 & 0 & 6 & 2 \\ 0 & 0 & 0 & 2 & 6 \end{pmatrix}$$

It should be noted that the dimensions of the matrices $S_{11}$ and $S_{21}$ depend on the valence of the irregular vertex.

A.0.3 Membrane and Bending Strain Matrices

The membrane and bending-strain matrices take the form:

$$M^I = \begin{bmatrix} N^I{,}_1\, a_1 \cdot e_1 & N^I{,}_1\, a_1 \cdot e_2 & N^I{,}_1\, a_1 \cdot e_3 \\ N^I{,}_2\, a_2 \cdot e_1 & N^I{,}_2\, a_2 \cdot e_2 & N^I{,}_2\, a_2 \cdot e_3 \\ (N^I{,}_2\, a_1 + N^I{,}_1\, a_2) \cdot e_1 & (N^I{,}_2\, a_1 + N^I{,}_1\, a_2) \cdot e_2 & (N^I{,}_2\, a_1 + N^I{,}_1\, a_2) \cdot e_3 \end{bmatrix} \quad (80)$$

and $$B^I = \begin{bmatrix} B_1^I \cdot e_1 & B_1^I \cdot e_2 & B_1^I \cdot e_3 \\ B_2^I \cdot e_1 & B_2^I \cdot e_2 & B_2^I \cdot e_3 \\ B_3^I \cdot e_1 & B_3^I \cdot e_2 & B_3^I \cdot e_3 \end{bmatrix} \quad (81)$$

respectively. In the above expression, $(e_1, e_2, e_3)$ are the basis vectors of an orthonormal-coordinate reference frame, and $$B_1^I = -N^I{,}_{11}\, a_3 + \frac{1}{\sqrt{a}}[N^I{,}_1\, a_{1,1} \times a_2 + N^I{,}_2\, a_1 \times a_{1,1} +$$
$$a_3 \cdot a_{1,1}(N^I{,}_1\, a_2 \times a_3 + N^I{,}_2\, a_3 \times a_3)]$$

$$B_2^I = -N^I{,}_{22}\, a_{33} + \frac{1}{\sqrt{a}}[N^I{,}_1\, a_{2,2} \times a_2 + N^I{,}_2\, a_1 \times a_{2,2} +$$
$$a_3 \cdot a_{2,2}(N^I{,}_1\, a_2 \times a_3 + N^I{,}_2\, a_3 \times a_3)]$$

$$B_3^I = -N^I{,}_{12}\, a_3 + \frac{1}{\sqrt{a}}[N^I{,}_1\, a_{1,2} \times a_2 + N^I{,}_2\, a_1 \times a_{1,2} +$$
$$a_3 \cdot a_{1,2}(N^I{,}_1\, a_2 \times a_3 + N^I{,}_2\, a_3 \times a_3)]$$

What is claimed is:

1. A computer-implemented method comprising:
   modeling an initial geometry of a shell;
   characterizing an environment for the shell, including environmental factors affecting mechanical behavior of the modeled shell, the environmental factors including loading conditions, material properties, and boundary conditions for the modeled shell, and the loading conditions including an indication of applied forces;
   computing by a computer a mechanical response of the modeled shell, taking into account said environmental factors, using a finite element analysis to compute a deformed geometry of the modeled shell, including generating smooth interpolated displacement fields possessing bounded energy according to a nonlocal subdivision-surfaces-based interpolation scheme, without using nodal rotations, such that resulting displacement fields defined over overlapping patches combine conformingly to define a limit surface; and
   outputting a description of the deformed geometry of the modeled shell as determined from the computed mechanical response.

2. The method of claim 1, wherein the loading conditions further include an indication of thermal loading.

3. The method of claim 1, further including outputting indications of the characterized environment.

4. A system comprising:

(a) means for modeling an initial geometry of a shell;

(b) means for characterizing an environment for the shell, including environmental factors affecting mechanical behavior of the modeled shell, the environmental factors including loading conditions, material properties, and boundary conditions for the modeled shell, and the loading conditions including an indication of applied forces;

(c) means for computing by a computer a mechanical response of the modeled shell, taking into account said environmental factors, using a finite element analysis, including means for generating smooth interpolated displacement fields possessing bounded energy according to a nonlocal subdivision-surfaces-based interpolation scheme, without using nodal rotations, such that resulting displacement fields defined over overlapping patches combine conformingly to define a limit surface; and (d) means for outputting a description of the deformed geometry of the modeled shell as determined from the computed mechanical response.

5. The system of claim 4, wherein the loading conditions further include an indication of thermal loading.

6. The system of claim 4, further including means for outputting indications of the characterized environment.

7. A computer program, residing on a computer-readable medium, the computer program comprising instructions for causing a computer to perform operations comprising:

(a) modeling an initial geometry of a shell;

(b) characterizing an environment for the shell, including environmental factors affecting mechanical behavior of the modeled shell, the environmental factors including loading conditions, material properties, and boundary conditions for the modeled shell, and the loading conditions including an indication of applied forces;

(c) computing by a computer a mechanical response of the modeled shell, taking into account the environmental factors, using a finite element analysis to compute a deformed geometry of the modeled shell, including generating smooth interpolated displacement fields possessing bounded energy according to a nonlocal subdivision-surfaces-based interpolation scheme, without using nodal rotations, such that resulting displacement fields defined over overlapping patches combine conformingly to define a limit surface; and (d) outputting a description of the deformed geometry of the modeled shell as determined from the computed mechanical response.

8. The computer program of claim 7, wherein the loading conditions further include an indication of thermal loading.

9. The computer program of claim 7, the operations further including outputting indications of the characterized environment.

* * * * *